US012592633B2

(12) United States Patent
Xiong et al.

(10) Patent No.: US 12,592,633 B2
(45) Date of Patent: Mar. 31, 2026

(54) POWER CONVERSION MODULE AND MAGNETIC DEVICE THEREOF

(71) Applicant: Delta Electronics, Inc., Taoyuan City (TW)

(72) Inventors: Yahong Xiong, Taoyuan City (TW); Junguo Cui, Taoyuan City (TW); Litao Qian, Taoyuan City (TW); Qinghua Su, Taoyuan City (TW)

(73) Assignee: Delta Electronics, Inc., Taoyuan City (TW)

( * ) Notice: Subject to any disclaimer, the term of this patent is extended or adjusted under 35 U.S.C. 154(b) by 841 days.

(21) Appl. No.: 17/588,026

(22) Filed: Jan. 28, 2022

(65) Prior Publication Data

US 2022/0294339 A1 Sep. 15, 2022

(30) Foreign Application Priority Data

Mar. 9, 2021 (CN) ......................... 202110256802.9
Nov. 11, 2021 (CN) ......................... 202111333821.3

(51) Int. Cl.
*H02M 3/00* (2006.01)
*H01F 27/02* (2006.01)
(Continued)

(52) U.S. Cl.
CPC ............ *H02M 3/003* (2021.05); *H01F 27/02* (2013.01); *H01F 27/263* (2013.01);
(Continued)

(58) Field of Classification Search
CPC ........ H02M 3/003; H02M 3/158; H02M 1/14; H02M 3/1586; H02M 1/00; H01F 27/02;
(Continued)

(56) References Cited

U.S. PATENT DOCUMENTS

| | | | |
|---|---|---|---|
| 6,060,977 A | 5/2000 | Yamamoto et al. | |
| 6,377,155 B1 | 4/2002 | Allen et al. | |

(Continued)

FOREIGN PATENT DOCUMENTS

| | | | |
|---|---|---|---|
| CN | 2629393 Y | * | 7/2004 |
| CN | 201149803 Y | | 11/2008 |

(Continued)

*Primary Examiner* — Tuyen T Nguyen
(74) *Attorney, Agent, or Firm* — KIRTON McCONKIE; Evan R. Witt

(57) ABSTRACT

A magnetic device includes a magnetic core assembly, a first winding and a second winding. The magnetic core assembly includes four magnetic legs and two winding grooves. An input terminal of the first winding is disposed within a first part of the first winding groove between the first magnetic leg and the second magnetic leg. An output terminal of the first winding is disposed within a second part of the second winding groove between the third magnetic leg and the fourth magnetic leg. An input terminal of the second winding is disposed within a first part of the second winding groove between the first magnetic leg and the fourth magnetic leg. An output terminal of the second winding is disposed within a second part of the first winding groove between the second magnetic leg and the third magnetic leg.

16 Claims, 20 Drawing Sheets

(51) Int. Cl.
    *H01F 27/26*         (2006.01)
    *H01F 27/30*         (2006.01)
    *H01F 27/40*         (2006.01)
    *H02M 3/158*        (2006.01)
    *H05K 1/181*        (2026.01)
    *H05K 1/185*        (2026.01)

(52) U.S. Cl.
    CPC ........... *H01F 27/306* (2013.01); *H01F 27/40*
        (2013.01); *H02M 3/158* (2013.01); *H05K*
        *1/181* (2013.01); *H05K 1/185* (2013.01);
        *H05K 2201/10015* (2013.01); *H05K*
        *2201/1003* (2013.01)

(58) Field of Classification Search
    CPC ...... H01F 27/263; H01F 27/306; H01F 27/40;
        H01F 2027/2809; H01F 3/10; H01F
        27/2804; H01F 27/34; H01F 27/24; H05K
        1/181; H05K 1/185; H05K 2201/10015;
        H05K 2201/1003; H05K 1/165; H05K
        2201/086; H05K 2201/09063
    See application file for complete search history.

(56)           References Cited

U.S. PATENT DOCUMENTS

| 7,612,640 | B2 * | 11/2009 | Sano ..................... H01F 27/255 |
| | | | 336/83 |
| 9,767,947 | B1 | 9/2017 | Ikriannikov |
| 12,334,249 | B2 | 6/2025 | Lu et al. |
| 2006/0181252 | A1 * | 8/2006 | Yoshida .............. H01F 27/2804 |
| | | | 363/131 |
| 2006/0187684 | A1 | 8/2006 | Chandrasekaran et al. |
| 2011/0286144 | A1 | 11/2011 | Ikriannikov |
| 2013/0207766 | A1 | 8/2013 | Kim et al. |
| 2016/0086723 | A1 | 3/2016 | Su et al. |
| 2017/0278622 | A1 | 9/2017 | Chen et al. |
| 2019/0148061 | A1 | 5/2019 | Lu et al. |

FOREIGN PATENT DOCUMENTS

| CN | 102881404 | A | 1/2013 |
| CN | 103003896 | A | 3/2013 |
| CN | 103107704 | A | 5/2013 |
| CN | 104240912 | A | 12/2014 |
| CN | 104980003 | A | 10/2015 |
| CN | 208706394 | U | 4/2019 |
| CN | 209343913 | U | 9/2019 |
| CN | 111292922 | A | 6/2020 |
| CN | 111478587 | A | 7/2020 |
| CN | 112038052 | A | 12/2020 |
| CN | 112712980 | A | 4/2021 |
| DE | 102014117551 | A1 | 6/2016 |

* cited by examiner 40a
40b
40c
40d
40e
40f
40g

POWER CONVERSION MODULE AND MAGNETIC DEVICE THEREOF

CROSS-REFERENCE TO RELATED APPLICATION

This application claims priority to China Patent Application No. 202110256802.9, filed on Mar. 9, 2021. This application also claims priority to China Patent Application No. 202111333821.3, filed on Nov. 11, 2021. The entire contents of which are incorporated herein by reference for all purposes.

FIELD OF THE INVENTION

The present disclosure relates to a power electronic device, and more particularly to a power conversion module and a magnetic device thereof.

BACKGROUND OF THE INVENTION

Nowadays, power electronic devices are important parts for converting electric power and widely used in power, electronics, electrical and energy industries. It is important for those skilled in the art to ensure the long-term stable operations of the power electronic devices and improve the power conversion efficiency of the power electronic devices.

With the rapid development of mobile communication technologies and cloud computing technologies, high-power DC/DC power conversion modules have also been widely used in communication products. Due to the high power and miniaturization of the communication products, it is a challenge for the power conversion modules to increase the power conversion efficiency and reduce the volume. Therefore, how to design a reasonable structure and layout for the power conversion module, improve the power conversion efficiency of the power conversion module and reduce the volume of the power conversion module is one of the popular issues in this technical field.

For reducing the volume of the output filter and expanding the system output power, the conventional power conversion module usually uses a parallel-connected circuit architecture. That is, the conventional power conversion module includes two power conversion circuits connected in parallel. For example, the conventional power conversion module includes two buck-type power conversion circuits connected in parallel. In order to optimize the ripple characteristics of the output current of the parallel-connected circuit, a magnetic integration technology is used to make a plurality of inductors in the two power conversion circuits of the power conversion module to form a magnetic integration coupling relationship. That is, two inductors of the two power conversion circuits are formed as two coupled inductors.

In accordance with the magnetic integration technology, the magnetic device of the conventional power conversion module includes two windings and a magnetic core. The cooperation of the two windings and the magnetic core results in the two coupled inductors. However, due to the winding positions and manufacture methods of the two windings in the magnetic device of the conventional power conversion module, some drawbacks occur. For example, an output terminal of one coupled inductor is close to the output terminal of the power conversion module, and an output terminal of the other coupled inductor is far away from the output terminal of the power conversion module. That is, the distances between each of the output terminals of the two coupled inductors and the output terminal of the power conversion module are different. Under this circumstance, the equivalent series resistances of the two coupled inductors are not symmetric, and the currents flowing through the two coupled inductors are not uniformly distributed. Since the DC magnetic fluxes flowing through the lateral legs of the magnetic core are larger, the lateral legs of the magnetic core are readily subjected to magnetic saturation. In other words, it is difficult to increase the performance of the power conversion module.

Therefore, there is a need of providing an improved power conversion module and a magnetic device of the power conversion module in order to overcome the drawbacks of the conventional technologies.

SUMMARY OF THE INVENTION

An object of the present disclosure provides a power conversion module and a magnetic device of the power conversion module to address the issues encountered by the prior arts. As previously described for the conventional power conversion module, the distances between each of the output terminals of the two coupled inductors and the output terminal of the power conversion module are different. Under this circumstance, the equivalent series resistances of the two coupled inductors are not symmetric, and the currents flowing through the two coupled inductors are not uniformly distributed. The lateral legs of the E-shaped core are readily subjected to magnetic saturation. It is difficult to increase the performance of the power conversion module.

Another object of the present disclosure provides a power conversion module with enhanced conversion performance and a magnetic device of the power conversion module.

In accordance with an aspect of the present disclosure, a magnetic device is provided. The magnetic device includes a magnetic core assembly, a first winding and a second winding. The magnetic core assembly includes a first magnetic leg, a second magnetic leg, a third magnetic leg, a fourth magnetic leg, a first winding groove and a second winding groove. The first magnetic leg and the third magnetic leg are opposed to each other. The second magnetic leg and the fourth magnetic leg are opposed to each other. The first magnetic leg and the third magnetic leg are disposed between the second magnetic leg and the fourth magnetic leg. A first part of the first winding groove is disposed between the first magnetic leg and the second magnetic leg. A second part of the first winding groove is disposed between the second magnetic leg and the third magnetic leg. A first part of the second winding groove is disposed between the first magnetic leg and the fourth magnetic leg. A second part of the second winding groove is disposed between the third magnetic leg and the fourth magnetic leg. An input terminal of the first winding is disposed within the first part of the first winding groove. An output terminal of the first winding is disposed within the second part of the second winding groove. An input terminal of the second winding is disposed within the first part of the second winding groove. An output terminal of the second winding is disposed within the second part of the first winding groove. A magnetic resistance of each of the second magnetic leg and the fourth magnetic leg is greater than a magnetic resistance of each of the first magnetic leg and the third magnetic leg.

In accordance with another aspect of the present disclosure, a power conversion module is provided. The power conversion module includes the magnetic device, a first power component and a second power component. The magnetic device includes a magnetic core assembly, a first winding and a second winding. The magnetic core assembly includes a first magnetic leg, a second magnetic leg, a third magnetic leg, a fourth magnetic leg, a first winding groove and a second winding groove. The first magnetic leg and the third magnetic leg are opposed to each other. The second magnetic leg and the fourth magnetic leg are opposed to each other. The first magnetic leg and the third magnetic leg are disposed between the second magnetic leg and the fourth magnetic leg. A first part of the first winding groove is disposed between the first magnetic leg and the second magnetic leg. A second part of the first winding groove is disposed between the second magnetic leg and the third magnetic leg. A first part of the second winding groove is disposed between the first magnetic leg and the fourth magnetic leg. A second part of the second winding groove is disposed between the third magnetic leg and the fourth magnetic leg. An input terminal of the first winding is disposed within the first part of the first winding groove. An output terminal of the first winding is disposed within the second part of the second winding groove. An input terminal of the second winding is disposed within the first part of the second winding groove. An output terminal of the second winding is disposed within the second part of the first winding groove. A magnetic resistance of each of the second magnetic leg and the fourth magnetic leg is greater than a magnetic resistance of each of the first magnetic leg and the third magnetic leg. The first power component is electrically connected with the input terminal of the first winding. The second power component is electrically connected with the input terminal of the second winding.

In accordance with another aspect of the present disclosure, a magnetic device is provided. The magnetic device includes a circuit board including at least one winding embedded therein and having at least one through hole. The at least one through hole is surrounded by the at least one winding, and a magnetic powder material is filled in the at least one through hole. The magnetic powder material filled in the at least one hole is formed as at least one first magnetic leg by pressing.

The above contents of the present disclosure will become more readily apparent to those ordinarily skilled in the art after reviewing the following detailed description and accompanying drawings, in which:

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1A:
FIG. 1A is a schematic assembled view illustrating a power conversion module according to a first embodiment of the present disclosure.
Figure 1A:
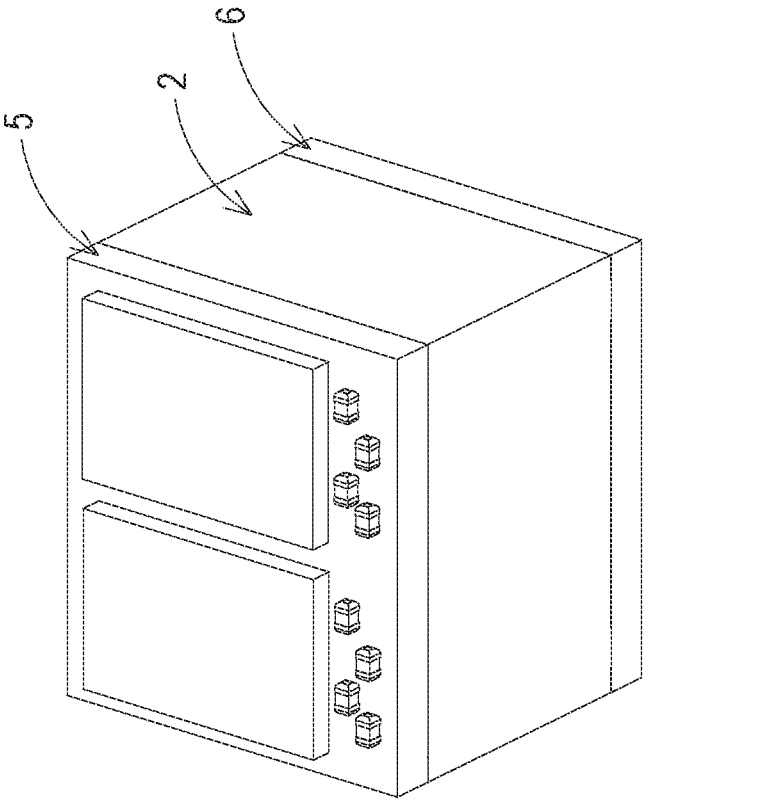
Figure 1B:
FIG. 1B is a schematic assembled view illustrating the power conversion module as shown in FIG. 1A and taken along another viewpoint.
Figure 1B:
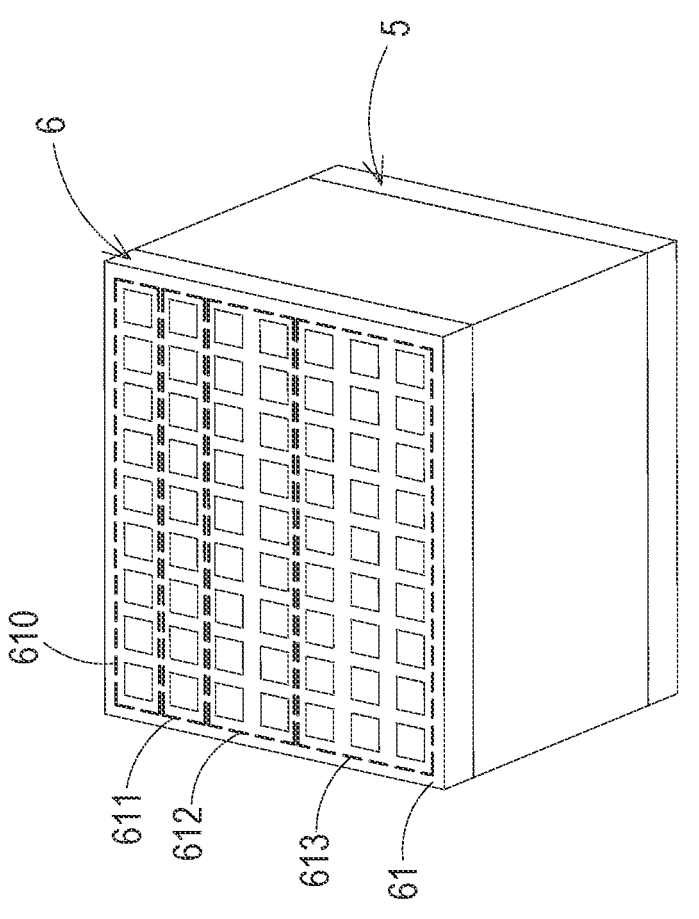
Figure 2A:
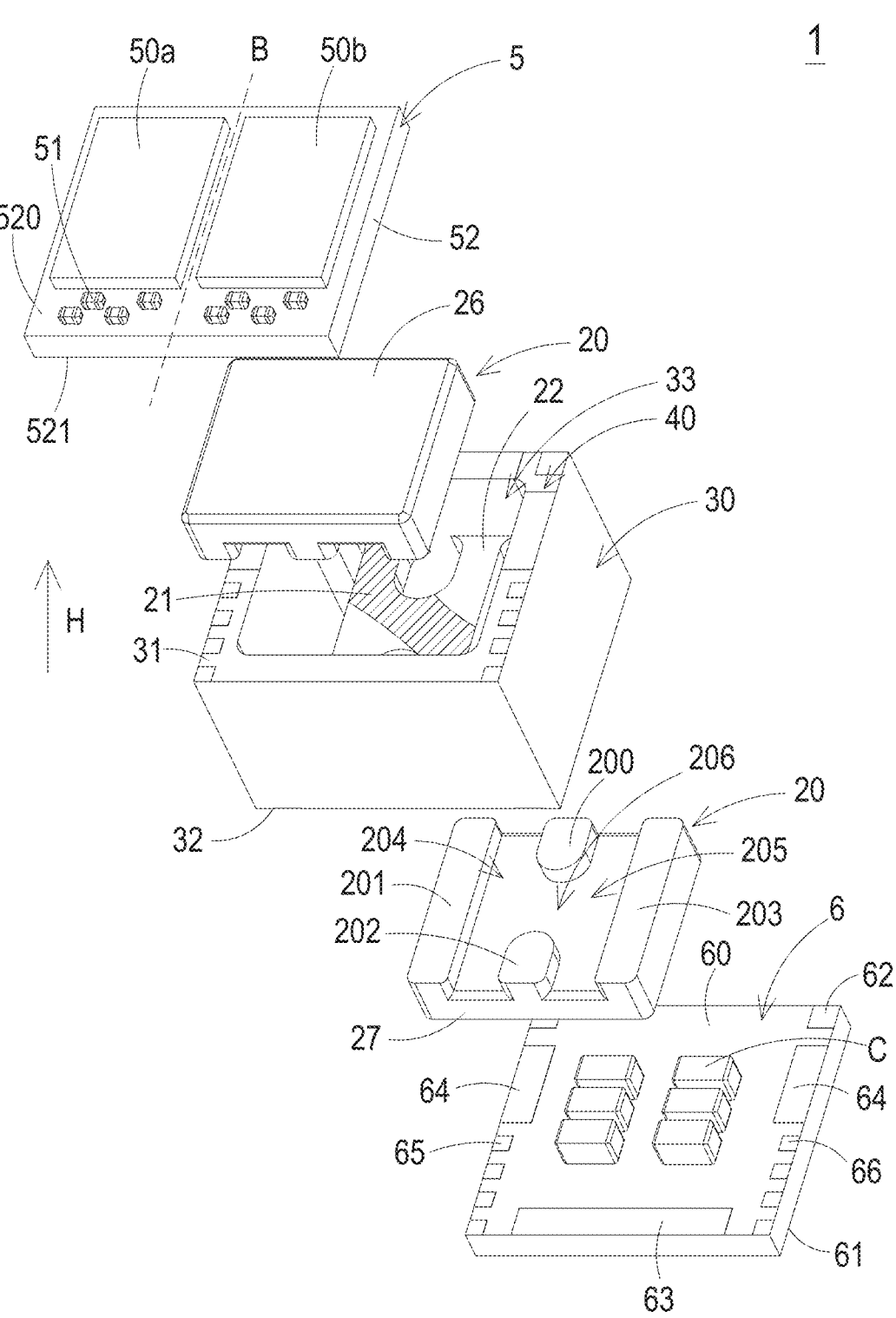
FIG. 2A is a schematic exploded view illustrating the power conversion module as shown in FIG. 1A and taken along another viewpoint.
Figure 2B:
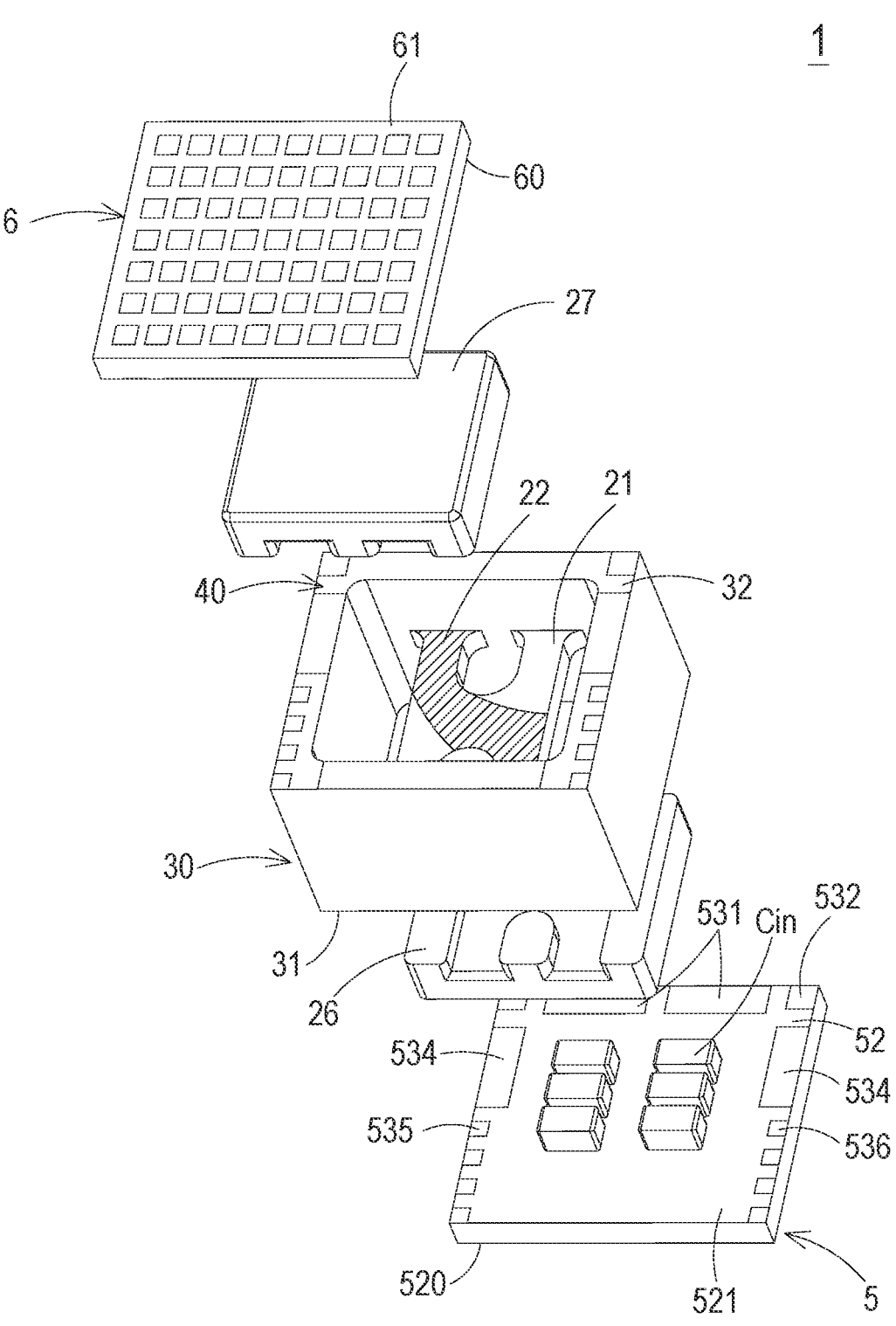
FIG. 2B is a schematic exploded view illustrating the power conversion module as shown in FIG. 2A and taken along another viewpoint.
Figure 3A:
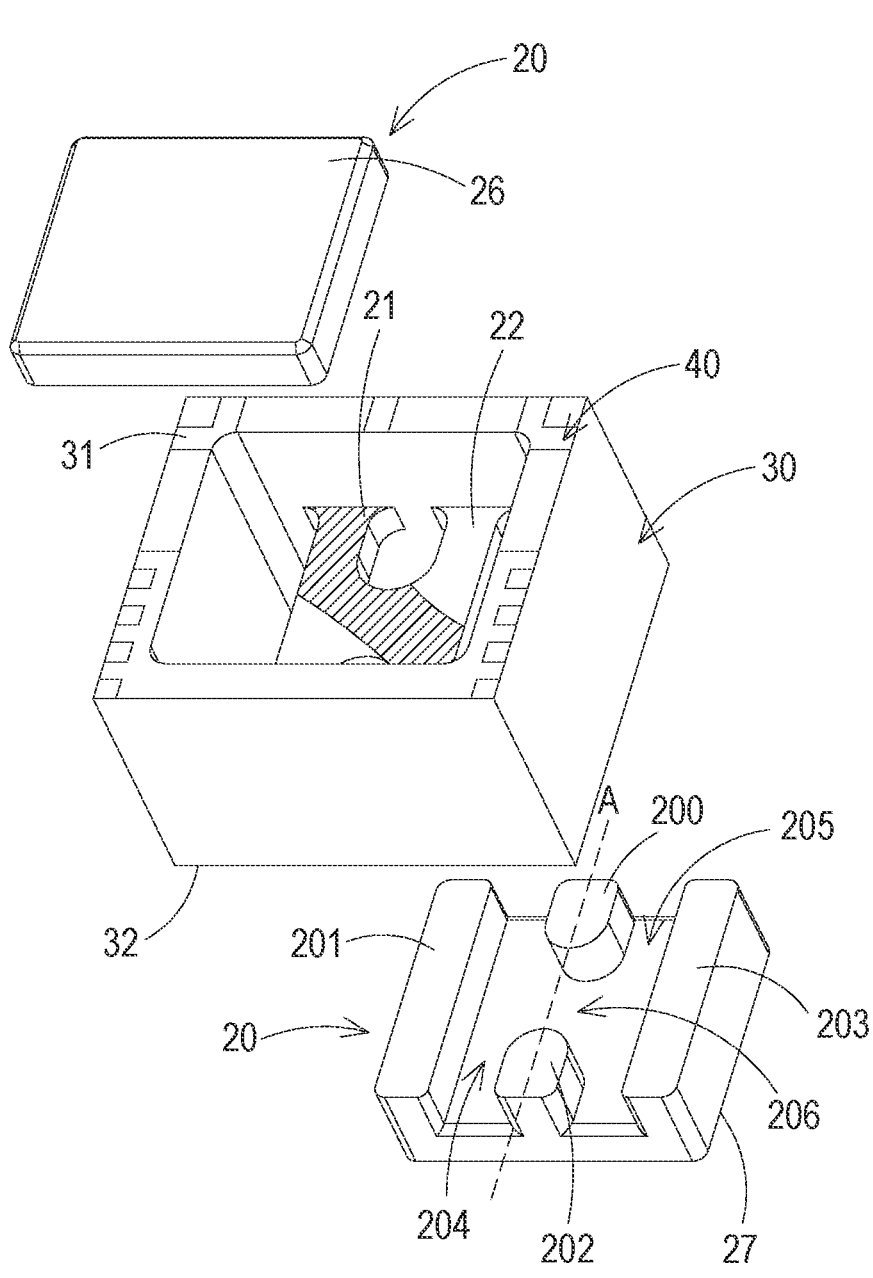
FIG. 3A is a schematic exploded view illustrating a magnetic device of the power conversion module according to the first embodiment of the present disclosure.
Figure 3B:
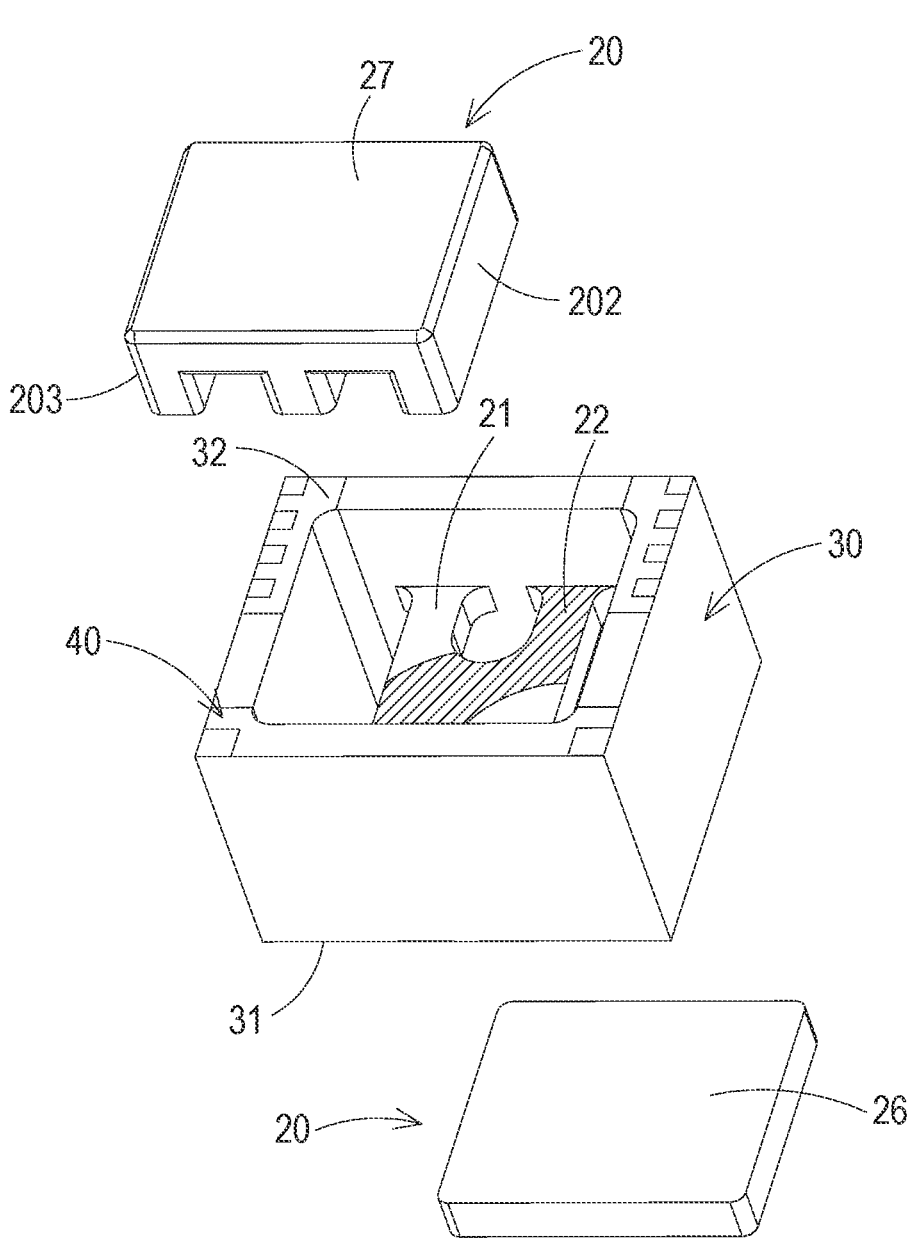
FIG. 3B is a schematic exploded view illustrating the magnetic device as shown in FIG. 3A.
Figure 4A:
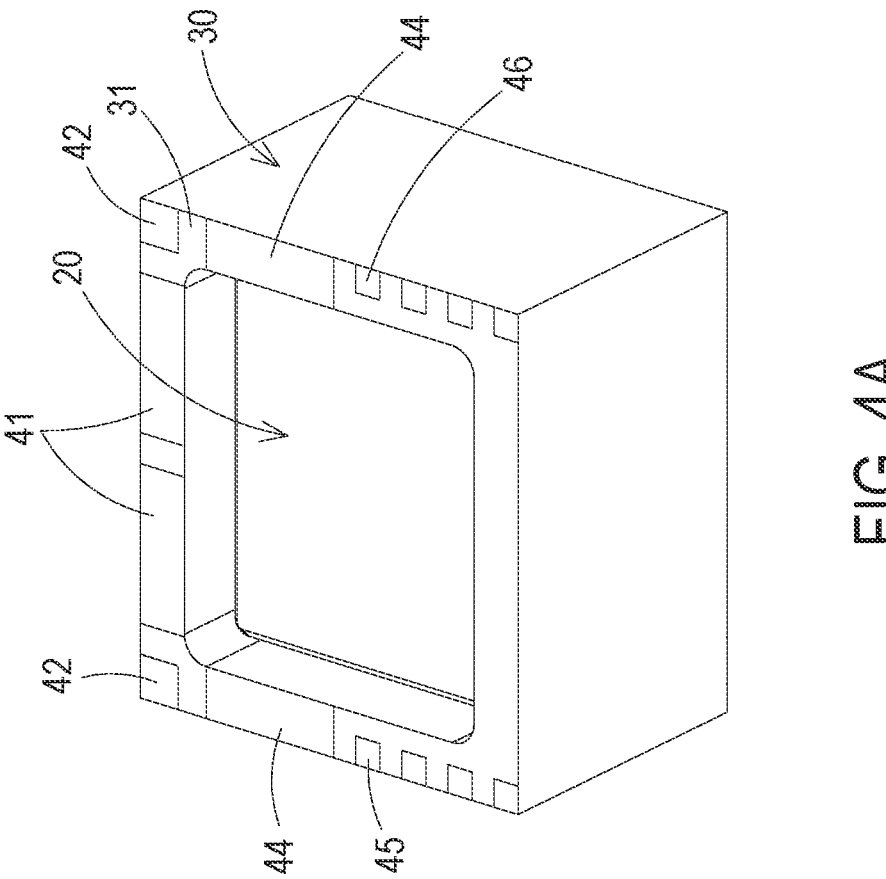
FIG. 4A is a schematic perspective view illustrating the magnetic device of the power conversion module according to the first embodiment of the present disclosure.
Figure 4B:
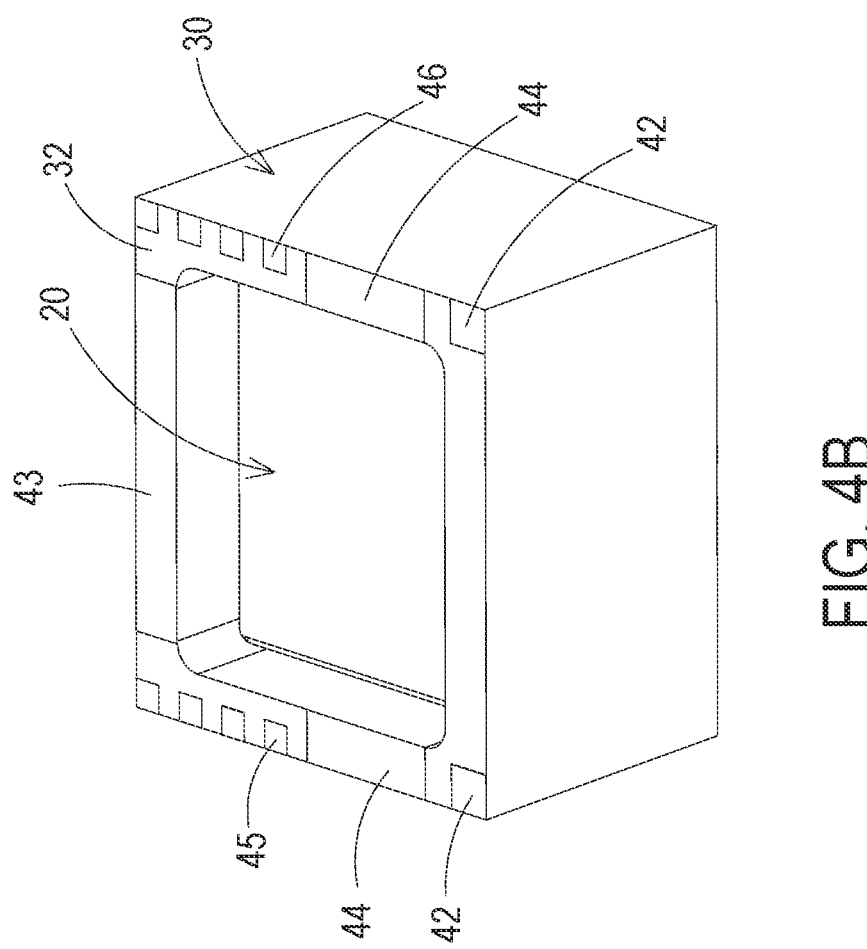
FIG. 4B is a schematic perspective view illustrating the magnetic device as shown in FIG. 4A.
Figure 5:
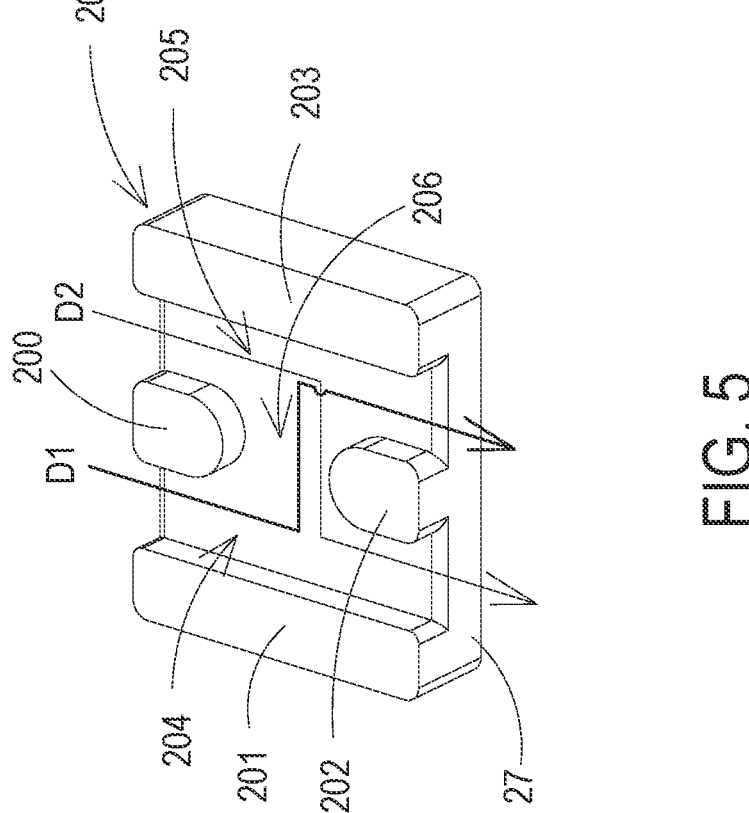
FIG. 5 schematically illustrates the directions of the currents flowing through the first winding and the second winding of the magnetic device as shown in FIG. 3A.
Figure 6:
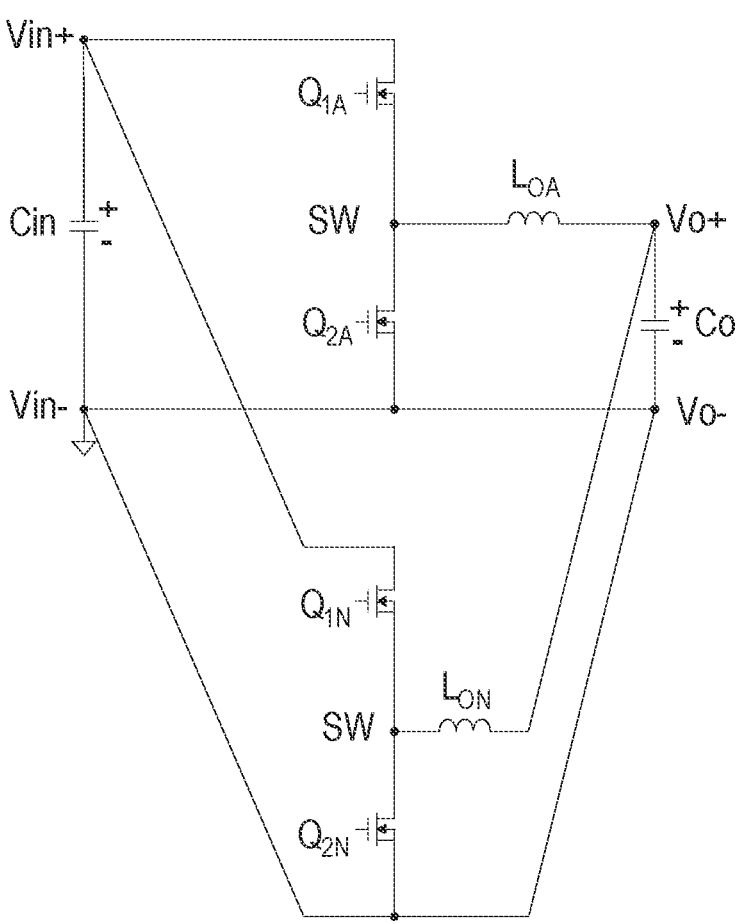
FIG. 6 is a schematic circuit diagram illustrating a circuit topology of the power conversion module according to the first embodiment of the present disclosure.

FIG. 1A is a schematic assembled view illustrating a power conversion module according to a first embodiment of the present disclosure. FIG. 1B is a schematic assembled view illustrating the power conversion module as shown in FIG. 1A and taken along another viewpoint. FIG. 2A is a schematic exploded view illustrating the power conversion module as shown in FIG. 1A and taken along another viewpoint. FIG. 2B is a schematic exploded view illustrating the power conversion module as shown in FIG. 2A and taken along another viewpoint. FIG. 3A is a schematic exploded view illustrating a magnetic device of the power conversion module according to the first embodiment of the present disclosure. FIG. 3B is a schematic exploded view illustrating the magnetic device as shown in FIG. 3A. FIG. 4A is a schematic perspective view illustrating the magnetic device of the power conversion module according to the first embodiment of the present disclosure. FIG. 4B is a schematic perspective view illustrating the magnetic device as shown in FIG. 4A. FIG. 5 schematically illustrates the directions of the currents flowing through the first winding and the second winding of the magnetic device as shown in FIG. 3A. FIG. 6 is a schematic circuit diagram illustrating a circuit topology of the power conversion module according to the first embodiment of the present disclosure. As shown in FIG. 6, the power conversion module 1 includes two buck-type power conversion circuits, which are connected with each other in parallel. The power conversion module 1 includes a magnetic device 2 and at least one power component.

The magnetic device 2 includes a magnetic core assembly 20, a first winding 21 and a second winding 22. The magnetic core assembly 20 includes a first magnetic leg 200, a second magnetic leg 201, a third magnetic leg 202, a fourth magnetic leg 203, a first winding groove 204 and a second winding groove 205. The first magnetic leg 200 and the third magnetic leg 202 are opposed to each other and separated from each other. The second magnetic leg 201 and the fourth magnetic leg 203 are opposed to each other and separated from each other. The first magnetic leg 200 and the third magnetic leg 202 are disposed between the second magnetic leg 201 and the fourth magnetic leg 203. A first part of the first winding groove 204 is disposed between the first magnetic leg 200 and the second magnetic leg 201. A second part of the first winding groove 204 is formed between the second magnetic leg 201 and the third magnetic leg 202. A first part of the second winding groove 205 is formed between the first magnetic leg 200 and the fourth magnetic leg 203. The second part of the second winding groove 205 is formed between the third magnetic leg 202 and the fourth magnetic leg 203.

The first winding 21 includes an input terminal and an output terminal. The input terminal of the first winding 21 is disposed within the first part of the first winding groove 204 between the first magnetic leg 200 and the second magnetic leg 201. The output terminal of the first winding 21 is disposed within the second part of the second winding groove 205 between the third magnetic leg 202 and the fourth magnetic leg 203. The second winding 22 includes an input terminal and an output terminal. The input terminal of the second winding 22 is disposed within the first part of the second winding groove 205 between the first magnetic leg 200 and the fourth magnetic leg 203. The output terminal of the second winding 22 is disposed within the second part of the first winding groove 204 between the second magnetic leg 201 and the third magnetic leg 202.

As shown in FIG. 5, the DC current flows through the first winding 21 in a first direction D1, and the DC current flows through the second winding 22 in a second direction D2. The directions of the DC currents flowing through the first winding 21 and the second winding 22 are the same. That is, the DC current flows through the first winding 21 in the direction from the first part of the first winding groove 204 between the first magnetic leg 200 and the second magnetic leg 201 to the second part of the second winding groove 205 between the third magnetic leg 202 and the fourth magnetic leg 203, and the DC current flows through the second winding 22 in the direction from the first part of the second winding groove 205 between the first magnetic leg 200 and the fourth magnetic leg 203 to the second part of the first winding groove 204 between the second magnetic leg 201 and the third magnetic leg 202. The two windings 21 and 22 and the magnetic core assembly 20 are collaboratively formed as two coupled inductors such as the two coupled inductors LOA and LON as shown in FIG. 6. In other embodiment, the two windings 21 and 22 and the magnetic core assembly 20 are collaboratively formed as a transformer.

In some embodiments, the magnetic core assembly 20 further includes a connection region 206. The connection region 206 is disposed between the first winding groove 204 and the second winding groove 205, and the connection region 206 is in connection with the first winding groove 204 and the second winding groove 205. In addition, a part of the first winding 21 is disposed within the connection region 206. That is, the first winding 21 is extended from the first winding groove 204 to the second winding groove 205 through the connection region 206. Similarly, a part of the second winding 22 is disposed within the connection region 206. That is, the second winding 22 is extended from the second winding groove 205 to the first winding groove 204 through the connection region 206. In other words, the part of the first winding 21 and the part of the second winding 22 in the connection region 206 intersect each other. In addition, an insulation medium (not shown) is formed in the intersection region between the first winding 21 and the second winding 22 in the connection region 206. That is, the insulation medium is disposed between the first winding 21 and the second winding 22. Consequently, the first winding 21 and the second winding 22 are isolated from each other through the insulation medium. Moreover, the overall structure of the magnetic core assembly 20, the first winding 21 and the second winding 22 are in mirror symmetry with respect to the line A that passes through the first magnetic leg 200 and the third magnetic leg 202.

In an embodiment, the magnetic core assembly 20 further includes a first magnetic cover 26 and a second magnetic cover 27, which are opposed to each other. The first magnetic leg 200, the second magnetic leg 201, the third magnetic leg 202 and the fourth magnetic leg 203 are disposed between the first magnetic cover 26 and the second magnetic cover 27. In an embodiment, the first ends of the first magnetic leg 200, the second magnetic leg 201, the third magnetic leg 202 and the fourth magnetic leg 203 are connected with the first magnetic cover 26. In other embodiment, the second ends of the first magnetic leg 200, the second magnetic leg 201, the third magnetic leg 202 and the fourth magnetic leg 203 are connected with the second magnetic cover 27. Alternatively, each of the first magnetic leg 200, the second magnetic leg 201, the third magnetic leg 202 and the fourth magnetic leg 203 includes two posts. One post of each magnetic leg is connected with the first magnetic cover 26, and the other post of each magnetic leg is connected with the second magnetic cover 27.

In an embodiment, the magnetic device 2 further includes a winding carrier 30 and a conductive structure 40. For example, the winding carrier 30 has a hollow box structure or a board structure. In addition, the shape of the winding carrier 30 matches the shape of the magnetic core assembly 20. The winding carrier 30 has a first surface 31 and a second surface 32, which are opposed to each other. The winding carrier 30 includes a hole 33 running through portion of the first surface 31 and portion of the second surface 32. The size and profile of the hole 33 substantially match the size and profile of the magnetic core assembly 20. Consequently, the magnetic core assembly 20 is embedded in the winding carrier 30 through the hole 33. The first magnetic cover 26 of the magnetic core assembly 20 is located near the first surface 31 of the winding carrier 30. The second magnetic cover 27 of the magnetic core assembly 20 is located near the second surface 32 of the winding carrier 30. The conductive structure 40 is disposed in the winding carrier 30 and located between the first surface 31 and the second surface 32 of the winding carrier 30. In addition, the conductive structure 40 is disposed around the periphery of the winding carrier 30, and at least a part of the conductive structure 40 is exposed on the first surface 31 or the second surface 32 of the winding carrier 30.

In addition, a part of the conductive structure 40 is formed as the first winding 21 and the second winding 22. At least portion of the first winding 21 and at least portion of the second winding 22 are disposed in the hole 33 of the winding carrier 30 and located between the first surface 31 and the second surface 32. The conductive structure 40 can be extended to the first surface 31 and/or the second surface 32 of the winding carrier 30. In other words, the input terminals and the output terminals of the first winding 21 and the second winding 22 can be extended to the first surface 31 and/or the second surface 32 of the winding carrier 30. For example, the input terminals of the first winding 21 and the second winding 22 are upwardly extended to the positions at the level higher than or close to the top surface of the first magnetic cover 26, and/or the input terminals of the first winding 21 and the second winding 22 are downwardly extended to the positions at the level lower than or close to the bottom surface of the second magnetic cover 27. Similarly, the output terminals of the first winding 21 and the second winding 22 are upwardly extended to the positions at the level higher than or close to the top surface of the first magnetic cover 26, and/or the output terminals of the first winding 21 and the second winding 22 are downwardly extended to the positions at the level lower than or close to the bottom surface of the second magnetic cover 27. In an embodiment, the conductive structure 40 is electroplated on an external wall of the winding carrier 30 between the first surface 31 and the second surface 32 of the winding carrier 30. The first surface of the winding carrier 30 is located at a level higher than the top surface of the first magnetic cover 26 of the magnetic core assembly 20. The second surface 32 of the winding carrier 30 is located at a level lower than the bottom surface of the second magnetic cover 27 of the magnetic core assembly 20. In FIG. 2A, a direction H is depicted, which is parallel to the decomposition direction of the power conversion module 1. The direction H is used to define the height relationship mentioned in this article. A position closer to direction pointed by the arrow of the direction H represents the higher the height of the component. On the contrary, a position farther from the direction of the arrow of the direction H represents the lower the height of the component.

The power device 5 has a plate structure. In an embodiment, the power device 5 is attached on the first surface 31 of the winding carrier 30. In addition, the power device 5 includes at least one power component, e.g., two power components 50a and 50b. Each of the power components 50a and 50b include a half-bridge arm with two switches. As shown in FIG. 6, the power component 50a includes a first half-bridge arm with two switches $Q_{1A}$ and $Q_{2A}$, and the power component 50b includes a second half-bridge arm with two switches $Q_{1N}$ and $Q_{2N}$. Each half-bridge arm is electrically connected with an input capacitor Cin. Moreover, each half-bridge arm is electrically connected with the corresponding winding of the first winding 21 and the second winding 22. For example, the first half-bridge arm of the power component 50a is electrically connected with the input terminal of the first winding 21, and the second half-bridge arm of the power component 50b is electrically connected with the input terminal of the second winding 22.

Moreover, the phase difference between the driving signals for controlling the two half-bridge arms is 180 degrees.

The power device 5 further includes a component assembly 51 and a circuit board 52. The circuit board 52 has a first surface 520 and a second surface 521, which are opposed to each other. The second surface 521 of the circuit board 52 is located near the first surface 31 of the winding carrier 30. The component assembly 51 and the power components 50a and 50b are disposed on the first surface 520 of the circuit board 52. The component assembly 51 includes portion of the input capacitors Cin, but not limited thereto.

In an embodiment, the two power components 50a and 50b are symmetrically disposed on the first surface 520 of the circuit board 52 with respect to a line B (FIG. 2A). The line B and the line A are in parallel with each other and aligned with each other (FIG. 3A). In an embodiment, the top surface of the two power components 50a and 50b are the topmost side of the power conversion module 1 in order to facilitate the installation of a heat sink (not shown). Moreover, at least one power component contact pad 531, at least one input positive terminal contact pad 532, at least one output negative terminal contact pad 534, at least one control signal contact pad 535 and at least one detection signal contact pad 536 are disposed on the second surface 521 of the circuit board 52. The at least one power component contact pad 531 is electrically connected with the power component pins SW of the power components 50a and 50b. The input positive terminal contact pad 532 is used as an input positive terminal Vin+ (see FIG. 6). The output negative terminal contact pad 534 is used as an output negative terminal Vo− (i.e., the ground terminal GND of the power conversion module 1). The control signal contact pad 535 is used for transferring control signals. The detection signal contact pad 536 is used for transferring sampling signals.

In an embodiment, the power conversion module 1 further includes a pin layer 6. The pin layer 6 is located near the second surface 32 of the winding carrier 30. The pin layer 6 has a first surface 60 and a second surface 61, which are opposed to each other. The pin layer 6 includes at least one input positive terminal 62, at least one output positive terminal 63, at least one output negative terminal 64, at least one control signal pin 65 and at least one detection signal pin 66, which are disposed on the first surface 60 of the pin layer 6. The first surface 60 of the pin layer 6 is located near the second magnetic cover 27. The at least one input positive terminal 62 is used as the input positive terminal Vin+ (see FIG. 6). The output negative terminal 64 is used as the output negative terminal Vo− (i.e., the ground terminal GND of the power conversion module 1). The output positive terminal 63 is used as an output positive terminal Vo+. Through the electrical traces of the pin layer 6, these terminals 62, 63 and 64 are electrically connected with corresponding external pins that are disposed on the second surface 32 of the winding carrier 30. Consequently, the power conversion module 1 can be electrically connected with an external circuit. The control signal pin 65 is used for transferring control signals. The detection signal pin 66 is used for transferring sampling signals.

As shown in FIG. 1B, a plurality of first terminals 610, a plurality of second terminals 611, a plurality of third terminals 612 and a plurality of fourth terminals 613 are formed on the second surface 61 of the pin layer 6. The first terminals 610 are used for transferring control signals and/or sampling signals. The second terminals 611 are electrically connected with the input positive terminal Vin+. The third terminals 612 are electrically connected with the output negative terminal Vo− (i.e., the ground terminal GND of the power conversion module 1). The fourth terminals 613 are electrically connected with the output positive terminal Vo+.

In an embodiment, the power conversion module 1 further includes an input capacitor Cin. The input capacitor Cin is connected across the input positive terminal and the input negative terminal of the power conversion module 1. In an embodiment, the input capacitor Cin is disposed between the power device 5 and the magnetic device 2. For example, the input capacitor Cin is disposed on the second surface 521 of the circuit board 52 of the power device 5 and disposed between the power device 5 and the magnetic core assembly 20 of the magnetic device 2. Alternatively, the input capacitor Cin is disposed between the power device 5 and the winding carrier 30 of the magnetic device 2, meanwhile disposed between the power device 5 and the magnetic core assembly 20 of the magnetic device 2. It is preferred that the input capacitor Cin is located near the power components 50a and 50b.

In an embodiment, the power conversion module 1 further includes an output capacitor Co. As shown in FIG. 2A, the output capacitor Co is disposed on the first surface 60 of the pin layer 6. That is, the output capacitor Co is disposed between the magnetic device 2 and the pin layer 6. It is noted that the installation position of the output capacitor Co is not restricted. For example, in other embodiment, the output capacitor Co is disposed on a system board (not shown). That is, the output capacitor Co is located outside the power conversion module 1. In an embodiment, the second terminal of the output capacitor Co is connected with the output positive terminal 63, and the first terminal of the output capacitor Co is connected with the output negative terminal 64.

Generally, during the switching processes of the power components 50a and 50b, the parasitic parameters between the input capacitor Cin and the power components 50a, 50b and the power components equivalent parameters may result in high-frequency parasitic oscillation. The high-frequency parasitic oscillation affects the switching processes and the power loss of the power components 50a and 50b. Since the input capacitor Cin is located near the power components 50a and 50b, the influence of the parasitic parameters can be reduced. In this way, the volume of the power conversion module 1 can be reduced, and the overall power density of the power conversion module 1 can be increased.

As mentioned above, the structure of the magnetic device 2 of the power conversion module 1 is specially designed. The input terminal of the first winding 21 is disposed within the first part of the first winding groove 204 between the first magnetic leg 200 and the second magnetic leg 201. The output terminal of the first winding 21 is disposed within the second part of the second winding groove 205 between the third magnetic leg 202 and the fourth magnetic leg 203. The input terminal of the second winding 22 is disposed within the first part of the second winding groove 205 between the first magnetic leg 200 and the fourth magnetic leg 203. The output terminal of the second winding 22 is disposed within the second part of the first winding groove 204 between the second magnetic leg 201 and the third magnetic leg 202. Since the first winding 21 and the second winding 22 intersect each other, the distances between each of the output terminals of the two coupled inductors and the output terminal 613 of the power conversion module 1 (see FIG. 1B) are nearly equal. In addition, the asymmetry of the equivalent series resistances of the two coupled inductors is reduced, and the currents flowing through the two coupled inductors are nearly equal. Since the DC magnetic fluxes flowing through the first magnetic leg 200 and the third magnetic leg 202 are nearly zero, the first magnetic leg 200 and the third magnetic leg 202 are not readily subjected to magnetic saturation. Moreover, due to the arrangement of the first winding 21 and the second winding 22, the distances between each of the output terminals of the two coupled inductors and the output terminal of the power conversion module 1 are the shortest. In this way, the minimum equivalent series resistances of the two coupled inductors can be achieved. Consequently, the conduction loss is largely reduced, and the performance of the power conversion module 1 is enhanced.

In an embodiment, the second magnetic leg 201 and the fourth magnetic leg 203 have air gaps, but the first magnetic leg 200 and the third magnetic leg 202 have no air gaps. In other embodiment, the second magnetic leg 201 and the fourth magnetic leg 203 have air gaps, and the first magnetic leg 200 and the third magnetic leg 202 also have air gaps. However, the air gap of each of the second magnetic leg 201 and the fourth magnetic leg 203 is longer than the air gap of each of the first magnetic leg 200 and the third magnetic leg 202. It is noted that the positions of the air gaps are not restricted. For example, the air gap is located at an upper portion of the corresponding magnetic leg and located near the first magnetic cover 26, or the air gap is located at a lower portion of the corresponding magnetic leg and located near the second magnetic cover 27, or the air gap is located at a middle region of the corresponding magnetic leg.

In an embodiment, a first voltage is across the input terminal and the output terminal of the first winding 21, and a second voltage is across the input terminal and the output terminal of the second winding 22. Moreover, the phase difference between the first voltage and the second voltage is 180 degrees. Consequently, the AC magnetic fluxes generated by the first winding 21 and the second winding 22 are cancelled out and evenly distributed to the first magnetic leg 200 and the third magnetic leg 202, wherein the directions of the AC magnetic fluxes generated by the first winding 21 and the second winding 22 on the first magnetic leg 200 and the third magnetic leg 202 are opposite. Moreover, the AC magnetic fluxes generated by the first winding 21 and the second winding 22 are superposed and evenly distributed to the second magnetic leg 201 and the fourth magnetic leg 203, wherein the directions of the AC magnetic fluxes generated by the first winding 21 and the second winding 22 on the second magnetic leg 201 and the fourth magnetic leg 203 are opposite. Moreover, the DC magnetic fluxes generated by the first winding 21 and the second winding 22 are cancelled out on the first magnetic leg 200, and the DC magnetic fluxes generated by the first winding 21 and the second winding 22 are cancelled out on the third magnetic leg 202.

In an embodiment, the power conversion module 1 may include a current-sharing circuit (not shown). Under control of the current-sharing circuit, the DC current flowing through the first winding 21 and the DC current flowing through the second winding 21 are nearly equal. Consequently, the DC magnetic flux on the first magnetic leg 200 and the DC magnetic flux on the third magnetic leg 202 are nearly zero. Moreover, the DC magnetic flux corresponding to the DC current flowing through the first winding 21 and the DC magnetic flux corresponding to the DC current flowing through the second winding 22 are superposed. The superposed DC magnetic flux is applied across the second magnetic leg 201 and the fourth magnetic leg 203. The air gaps of the second magnetic leg 201 and the fourth magnetic leg 203 can resist the superposed DC magnetic flux in order to avoid the saturation of the second magnetic leg 201 and the fourth magnetic leg 203. If the DC current flowing through the first winding 21 and the DC current flowing through the second winding 22 are not equal under control of the current-sharing circuit, the DC magnetic flux on the first magnetic leg 200 and the DC magnetic flux on the third magnetic leg 202 are non-zero. For avoiding the saturation of the first magnetic leg 200 and the third magnetic leg 202, it is preferred that the first magnetic leg 200 and the third magnetic leg 202 have air gaps.

Moreover, the AC magnetic flux of the first magnetic leg 200 is large, but the air gap and the magnetic resistance of the first magnetic leg 200 are small. When compared with the first magnetic leg 200, the air gap and the magnetic resistance of the second magnetic leg 201 are larger. Since the AC magnetic flux on the second magnetic leg 201 is smaller, the ripple of the AC current of the first winding 21 is low, and the equivalent inductance of the first winding 21 is high. Similarly, the AC magnetic flux of the third magnetic leg 202 is large, but the air gap and the magnetic resistance of the third magnetic leg 202 are small. When compared with the third magnetic leg 202, the air gap and the magnetic resistance of the fourth magnetic leg 203 are larger. Since the AC magnetic flux on the fourth magnetic leg 203 is smaller, the ripple of the AC current of the second winding 22 is low, and the equivalent inductance of the second winding 22 is high. Since the ripple of the AC current is reduced and the capability of withstanding magnetic saturation is increased, the performance of the power conversion module 1 is enhanced.

In an embodiment, preferably, the material of the first magnetic leg 200 and the third magnetic leg 202 is different from the material of the rest of the magnetic core assembly 20. For example, the first magnetic leg 200 and the third magnetic leg 202 are made of ferrite, and the rest of the magnetic core assembly 20 is made of iron powder with distributed air gap. Consequently, the core loss of the magnetic core assembly 20 is low, and the equivalent inductance of the two windings of the magnetic core assembly 20 is high. In an embodiment, the total cross section area of the second magnetic leg 201 and the fourth magnetic leg 203 is greater than the total cross section area of the first magnetic leg 200 and the third magnetic leg 202. Moreover, the cross section area of the second magnetic leg 201 is approximately equal to the cross section area of the fourth magnetic leg 203, and a tolerance thereof is within ±20%. The cross section area of the first magnetic leg 200 is approximately equal to the cross section area of the third magnetic leg 202, and a tolerance thereof is within ±20%.

In an embodiment, the output terminal of the first winding 21 and the output terminal of the second winding 22 are connected with each other at an outside of the third magnetic leg 202 (i.e., the outside of the power conversion module 1) and electrically connected with the output positive terminal 63.

In the above embodiment, a part of the conductive structure 40 is formed as the first winding 21 and the second winding 22. It is noted that numerous modifications and alterations may be made while retaining the teachings of the disclosure. For example, in another embodiment, two copper bars are embedded in the winding carrier 30, and the two copper bars are respectively used as the first winding 21 and the second winding 22. In other embodiment, two copper bars are directly embedded in the magnetic core assembly 20 and disposed between the first magnetic cover 26 and the second magnetic cover 27, and the two copper bars are respectively used as the first winding 21 and the second winding 22. Moreover, the intersection region between two copper bars (i.e., the first winding 21 and the second winding 22) in the connection region 206 are isolated from each other through the insulation medium (not shown).

Figure 4C:
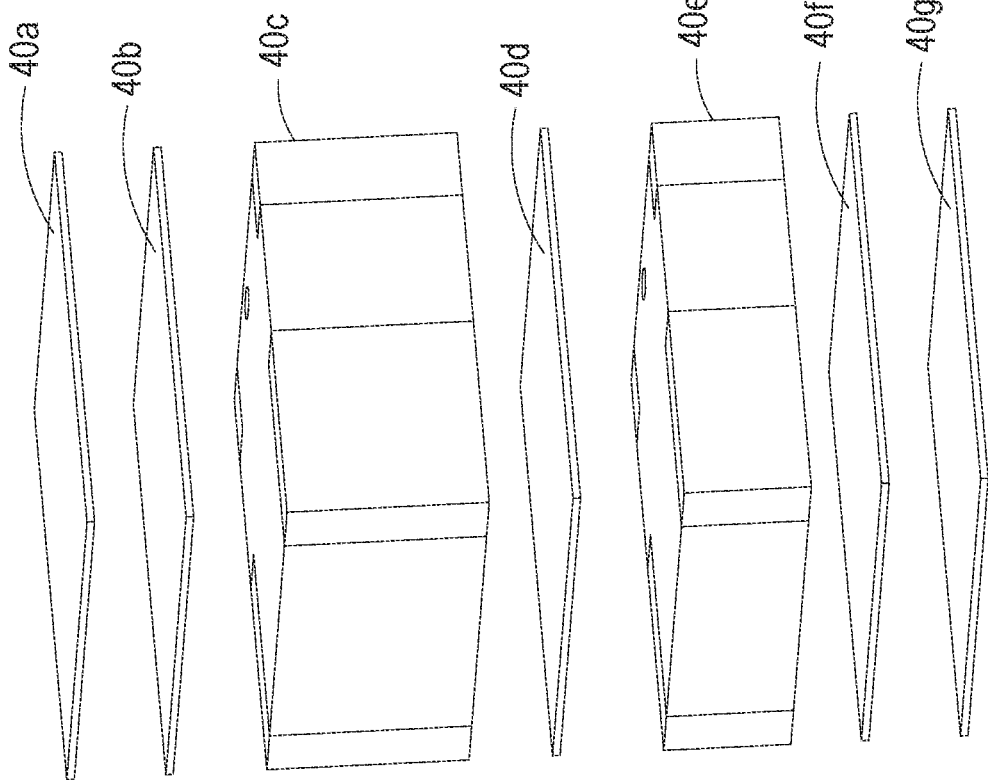
FIG. 4C is a schematic exploded view illustrating a plurality of layers for fabricating the conductive structure of the power conversion module.
Figures 4D, 4E:
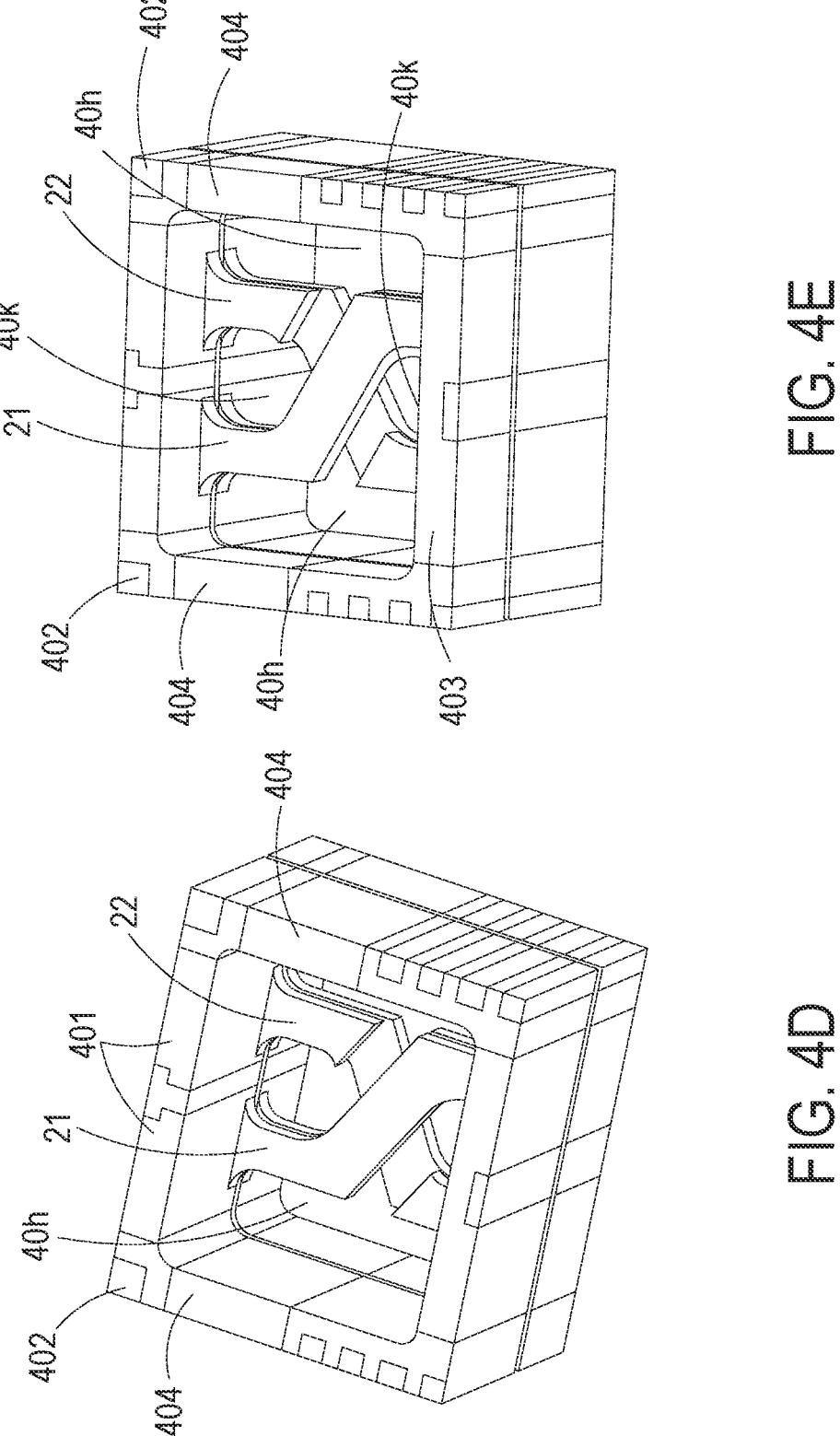
FIGS. 4D and 4E are schematic perspective views illustrating the conductive structure and taken along different viewpoints.
Figure 4F:
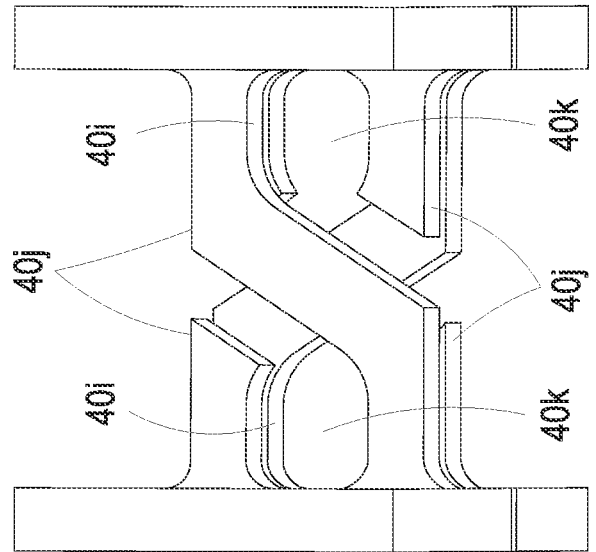
FIG. 4F schematically illustrates the relationship between the first winding and the second winding of the conductive structure.

Please refer to FIGS. 4A and 4B again. In an embodiment, the conductive structure 40 includes at least one copper layer, which is distributed in the outer wall and the inner wall of the winding carrier 30. Alternatively, as shown in FIGS. 4C, 4D, 4E and 4F, the conductive structure 40 is embedded in the winding carrier 30. Hereinafter, a process of fabricating the first winding 21 and the second winding 22 will be illustrated with reference to FIGS. 4C, 4D, 4E and 4F. Firstly, as shown in FIG. 4C, a first copper foil layer 40a, a first PP layer 40b, a first copper plate 40c, a second PP layer 40d, a second copper plate 40e, a third PP layer 40f and a second copper foil layer 40g are provided. Then, these seven layers are laminated as a circuit board. The first copper plate 40c and the second copper plate 40e are isolated from each other through the second PP layer 40d. Then, as shown in FIGS. 4D and 4E, the above-mentioned circuit board with laminated structure is subjected to a surface etching process and a milling process, so that two magnetic core slots 40h are generated. Then, a controlled deep milling process is performed, so that the first copper plate 40c and the second copper plate 40e are processed to have the first winding 21, the second winding 22 and two through holes 40k surrounded by the first winding 21 and the second winding 22 as shown in FIG. 4F. As mentioned above, the first copper plate 40c and the second copper plate 40e are isolated from each other through the second PP layer 40d. In other words, the winding copper bar of the first copper plate 40c and the winding copper bar of the second copper plate 40e at the intersection region are isolated through an insulation medium (i.e., the second PP layer 40d). The inner walls 40i of the copper bars of the first winding 21 and the second winding 22 are connected through a lateral electroplated structure, and the outer walls 40j of the copper bars of the first winding 21 and the second winding 22 are connected through a lateral electroplated structure. Consequently, the input terminals and the output terminals of the first winding 21, and the input terminals and the output terminals of the second winding 22 are formed. As shown in FIG. 4F, the first winding 21 and the second winding 22 are separated by an insulation medium (i.e., the second PP layer 40d) at the intersection region, and the first winding 21 and the second winding 22 at the intersection region are not connected by lateral circuit. The first winding 21 and the second winding 22 constituted by the cooper bars are connected at the non-intersection region by lateral electroplated structure. In this way, the utilization efficiency of the copper material in the circuit board is increased, and the equivalent DC resistance of the windings is largely reduced. In addition, the two magnetic core slots 40h are configured to accommodate the second magnetic leg 201 and the fourth magnetic leg 203, and the two through holes 40k are configured to accommodate the first magnetic leg 200 and the third magnetic leg 202.

The conductive structure 40 includes at least one first connection part 401, at least one second connection part 402, at least one third connection part 404 and at least one fourth connection part 403. The first connection part 401 is partially exposed to the first surface 31 of the winding carrier 30 and formed as a power component terminal contact surface 41. The power component terminal contact surfaces 41 are connected with the power component pins SW of the power components 50a and 50b, respectively. The second connection part 402 and the third connection part 404 are partially exposed to the first surface 31 and the second surface 32 of the winding carrier 30 and formed as an input positive terminal contact surface 42 and an output negative terminal contact surface 44. The input positive terminal contact surface 42 is connected with the input positive terminal Vin+. The output negative terminal contact surface 44 is connected with the output negative terminal Vo−. In addition, the output negative terminal contact surface 44 is connected upwardly with the GND mesh of the power device 5 and connected downwardly with the GND mesh of the pin layer 6. The fourth connection part 403 is partially exposed to the second surface 32 of the winding carrier 30 and formed as an output positive terminal contact surface 43.

The conductive structure 40 further includes some additional connection parts. The first end surfaces of the additional connection parts are partially exposed to the first surface 31 of the winding carrier 30. The second end surfaces of the additional connection parts are partially exposed to the second surface 32 of the winding carrier 30. Consequently, control signal pin contact surfaces 45 and detection signal pin contact surfaces 46 (see FIG. 4A) are formed correspondingly. The power device 5 and the pin layer 6 of the power conversion module 1 (or the at least one power component and the system board) are in communication with each other through the control signal pin contact surfaces 45. The detection signal pin contact surfaces 46 are used for transferring sampling signals.

The at least one input positive terminal 62 of the pin layer 6 is electrically connected with the corresponding input positive terminal contact surface 42. The at least one output positive terminal 63 is electrically connected with the corresponding output positive terminal contact surface 43. The at least one output negative terminal 64 is electrically connected with the corresponding output negative terminal contact surface 44. The at least one control signal pin 65 is electrically connected with the corresponding control signal pin contact surface 45. The at least one detection signal pin 66 is electrically connected with the corresponding detection signal pin contact surface 46. The at least one input positive terminal contact pad 532 of the power device 5 is electrically connected with the corresponding input positive terminal contact surface 42. The at least power component contact pad 531 is electrically connected with the corresponding power component terminal contact surface 41. The at least one output negative terminal contact pad 534 is electrically connected with the corresponding output negative positive terminal contact surface 44. The at least one control signal contact pad 535 is electrically connected with the corresponding control signal pin contact surface 45. The at least one detection signal contact pad 536 is electrically connected with the corresponding detection signal pin contact surface 46.

In another embodiment, the output positive terminal contact surfaces 43, the input positive terminal contact surfaces 42, the output negative terminal contact surfaces 44, the control signal pin contact surfaces 45 and the detection signal pin contact surfaces 46 are used as external pins of the power conversion module 1 and directly connected with the system board. Under this circumstance, the power conversion module 1 omits the pin layer, and thus the thickness of the power conversion module 1 is reduced.

In an embodiment, the conductive structure 40 and the winding carrier 30 are integrated as an integrated structure by using a molding process. Preferably but not exclusively, the winding carrier 30 is made of epoxy resin or PCB material. For effectively increasing the power density of the power conversion module 1, the winding carrier 30 is a multi-layered printed circuit board, and the magnetic core assembly 20 and the conductive structure 40 are embedded in the winding carrier 30. A part of the conductive structure 40 is formed as the first winding 21 and the second winding 22, which are located at different layers of the multi-layered printed circuit board. The output terminals of the power components 50a and 50b are directly connected with the magnetic device 2.

As shown in FIGS. 2A, 2B, 4C, 4D, 4E and 4F, the winding carrier 30 and the conductive structure 40 (including the first winding 21 and the second winding 22) formed by the circuit board with laminated structure are formed as an integrated structure. The magnetic core assembly 20 is different from the integrated structure formed by the winding carrier 30 and the conductive structure 40 and is an independent component. The magnetic core assembly 20 and the conductive structure 40 are combined to form an inductor or a transformer.

Figure 4G:
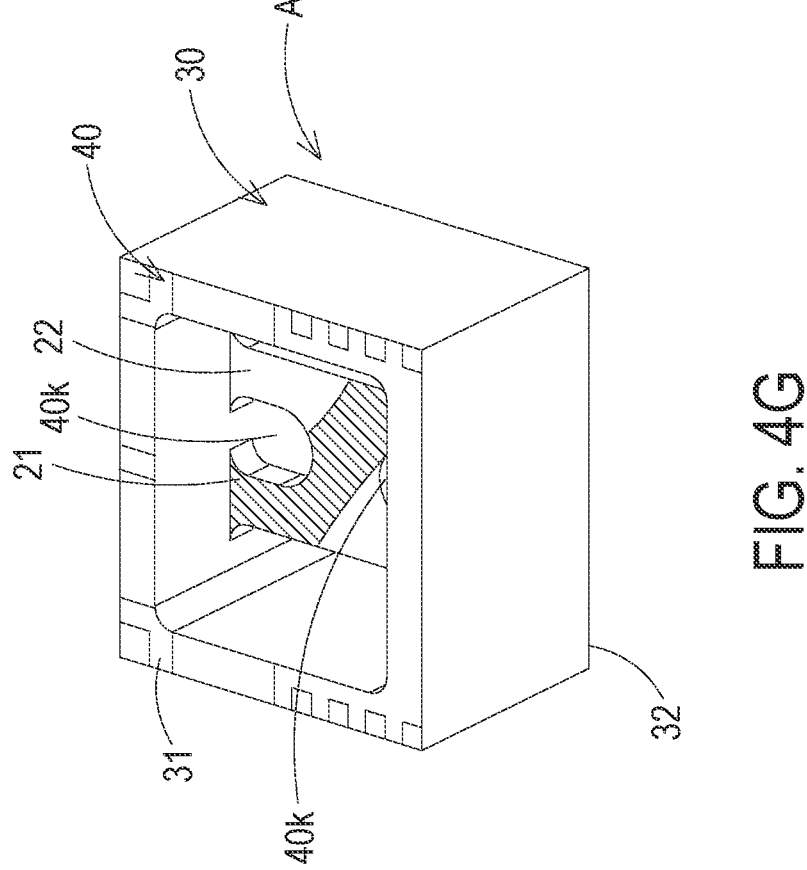
FIG. 4G is a schematic perspective view illustrating an integrated structure formed by a winding carrier, the conductive structure, the first winding and the second winding of FIG. 3A.

In order to reduce the horizontal assembly tolerance and the longitudinal assembly tolerance among the winding carrier 30, the conductive structure 40 and the magnetic core assembly 20 and avoid the issues such as low space utilization of the magnetic device, small effective cross section of the magnetic core assembly 20, low inductance of the inductor and large core loss of the inductor, in some embodiments, the magnetic core assembly 20 shown in FIG. 4A can be formed by pressing iron powder materials on the integrated structure formed by the winding carrier 30 and the conductive structure 40. The process of manufacturing the magnetic core assembly 20 shown in FIG. 4A on the integrated structure formed by the winding carrier 30 and the conductive structure 40 (hereinafter referred to as the integrated structure A) is described as follows with reference to FIG. 4G. When the manufacturing process shown in FIGS. 4C, 4D, 4E and 4F is completed and the integrated structure A shown in FIG. 4G is formed (i.e., it is equivalent to the integrated structure of the winding carrier 30 and the conductive structure 40 shown in FIGS. 2A and 2B), the integrated structure A is fixed in a hollow cavity of a mold (not shown).

Then, a specific amount of magnetic powder material is filled in the hollow cavity of the mold for allowing the magnetic powder material to fill the hole 33 and cover the two magnetic core slots 40h and the two through holes 40k. Then, the magnetic powder material is pressed, so that the magnetic powder is bonded to each other to form the magnetic core assembly 20. The magnetic powder materials located in the two magnetic core slots 40h are formed as the second magnetic leg 201 and the fourth magnetic leg 203 as shown in FIG. 2A. The magnetic powder materials located in the two through holes 40k are formed as the first magnetic leg 200 and the third magnetic leg 202 as shown in FIG. 2A. The magnetic powder materials located on two opposed surfaces of the circuit board with laminated structure are formed as the first magnetic cover 26 and the second magnetic cover 27. In addition, the magnetic core assembly 20 and the integrated structure A are further bonded to each other to form an integrated magnetic device 2 as shown in FIGS. 4A and 4B. The first surface of the first magnetic cover 26 and the first surface of the second magnetic cover 27 are formed as two opposed surfaces of the magnetic core assembly 20. The first surface of the first magnetic cover 26 is substantially parallel to the first surface 31 of the winding carrier 30. The first surface 31 of the winding carrier 30 is closer to the first surface of the first magnetic cover 26 than the first surface of the second magnetic cover 27. The first surface of the second magnetic cover 27 is substantially parallel to the second surface 32 of the winding carrier 30.

The second surface 32 of the winding carrier 30 is closer to the first surface of the second magnetic cover 27 than the first surface of the first magnetic cover 26. In addition, the level of the first surface of the first magnetic cover 26 is lower than the level of the first surface 31 of the winding carrier 30, so that a first recess area is defined by the first surface of the first magnetic cover 26 and the first surface 31 of the winding carrier 30. The first recess area is configured to accommodate electronic component, such as the input capacitor Cin, etc. Alternatively, the level of the first surface of the first magnetic cover 26 is equal to the level of the first surface 31 of the winding carrier 30. In addition, the level of the first surface of the second magnetic cover 27 is higher than the level of the second surface 32 of the winding carrier 30, so that a second recess area is defined by the first surface of the second magnetic cover 27 and the second surface 32 of the winding carrier 30. The second recess area is configured to accommodate electronic component, such as the output capacitor Co, etc. Consequently, the external pins on the second surface 32 of the winding carrier 30 can be electrically connected to the system board directly. That is, the second surface 32 of the winding carrier 30 is used as the external welding surface of the power conversion module. Alternatively, the power device 5 is disposed on the first surface 31 of the winding carrier 30, the pin layer 6 is disposed on the second surface 32 of the winding carrier 30, and the pin layer 6 is fixed and electrically connected to the system board.

In an embodiment, the first magnetic leg 200, the second magnetic leg 201, the third magnetic leg 202 and the fourth magnetic leg 203 are formed by filling the magnetic powder material, and then the first magnetic cover 26 and the second magnetic cover 27 are assembled to form the magnetic core assembly 20.

A plurality of advantages are provided by forming the magnetic core assembly by means of pressing the magnetic powder material with the integrated structure A including the winding carrier 30 and the conductive structure 40. That is, the integration of the circuit and the magnetic loop is realized. In addition, the horizontal assembly tolerance and the longitudinal assembly tolerance between the integrated structure A and the magnetic core assembly 20 are very small or even none. Consequently, the space utilization of the magnetic core assembly 20 is greatly improved, and the effective cross-section of the magnetic core assembly 20 is larger. The inductance of the magnetic device 2 is increased, and the core loss of the magnetic device 2 is reduced.

The present disclosure further provides other possible embodiments of the power conversion modules. Component parts and elements corresponding to those of the first embodiment are designated by identical numeral references, and detailed descriptions thereof are omitted.

Figure 7:
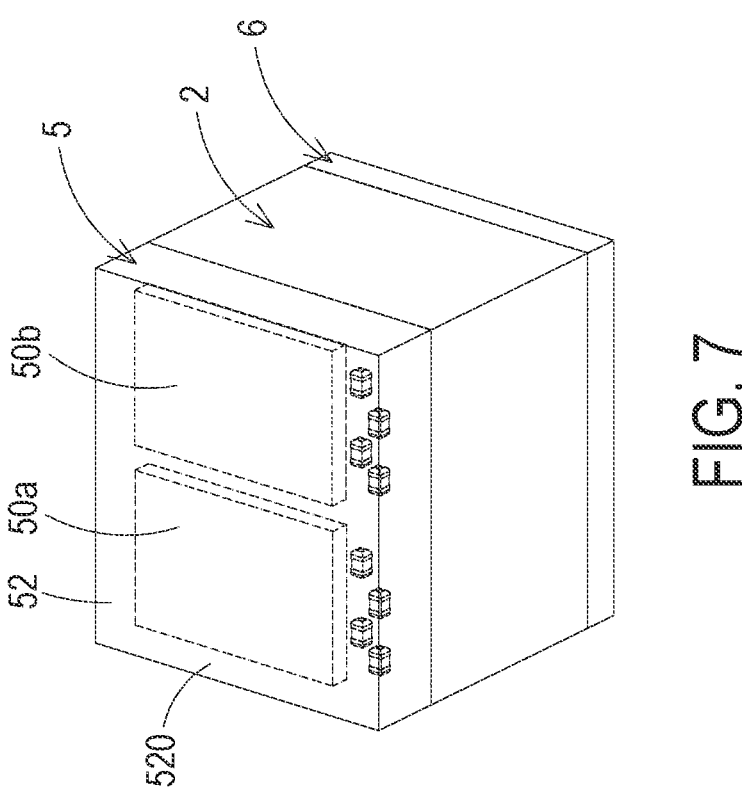
FIG. 7 is a schematic perspective view illustrating a power conversion module according to a second embodiment of the present disclosure.

FIG. 7 is a schematic perspective view illustrating a power conversion module according to a second embodiment of the present disclosure. In comparison with the power conversion module 1 of the first embodiment, the two power components 50a and 50b (i.e., the two half-bridge arms) and the component assembly 51 of the power conversion module 1b in this embodiment are embedded in the circuit board 52. Consequently, the difficulty of performing the printed circuit board assembly (PCBA) is reduced. Since no other electronic components are disposed on the first surface 520 of the circuit board 52, a heat sink (not shown) can be disposed on the first surface 520 of the circuit board 52 more easily.

Figure 8A:
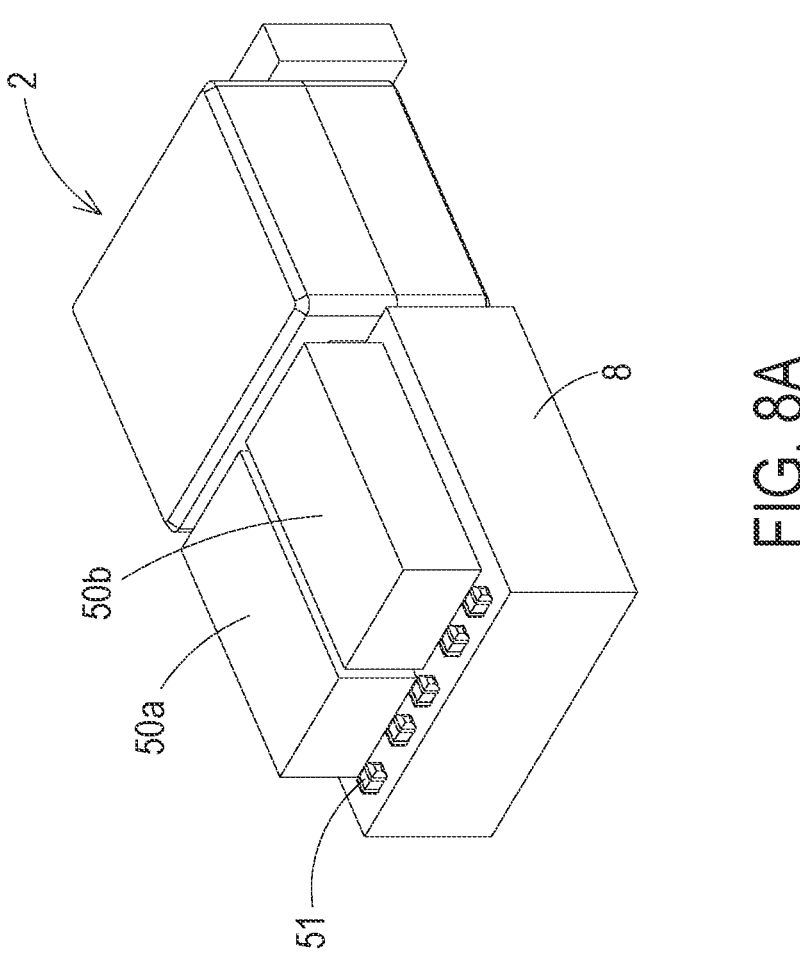
FIG. 8A is a schematic assembled view illustrating a power conversion module according to a third embodiment of the present disclosure.
Figure 8B:
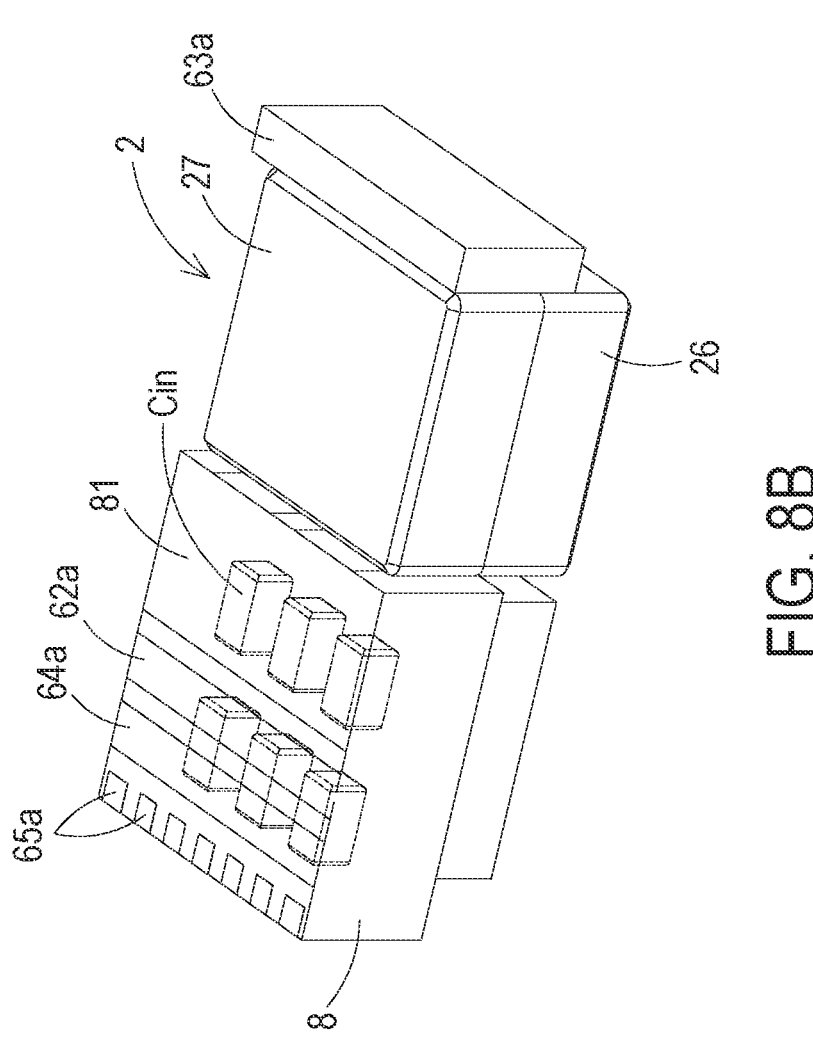
FIG. 8B is a schematic assembled view illustrating the power conversion module as shown in FIG. 8A and taken along another viewpoint.
Figure 9A:
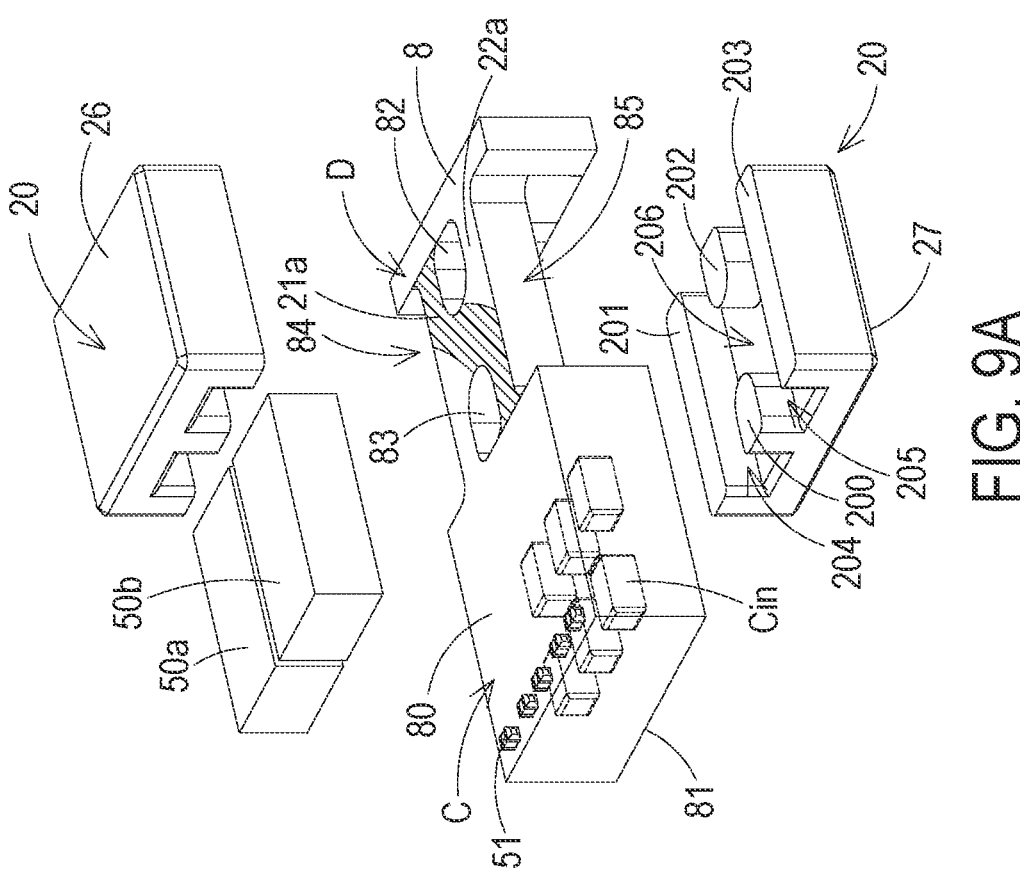
FIG. 9A is a schematic exploded view illustrating the power conversion module as shown in FIG. 8A and taken along another viewpoint.
Figure 9B:
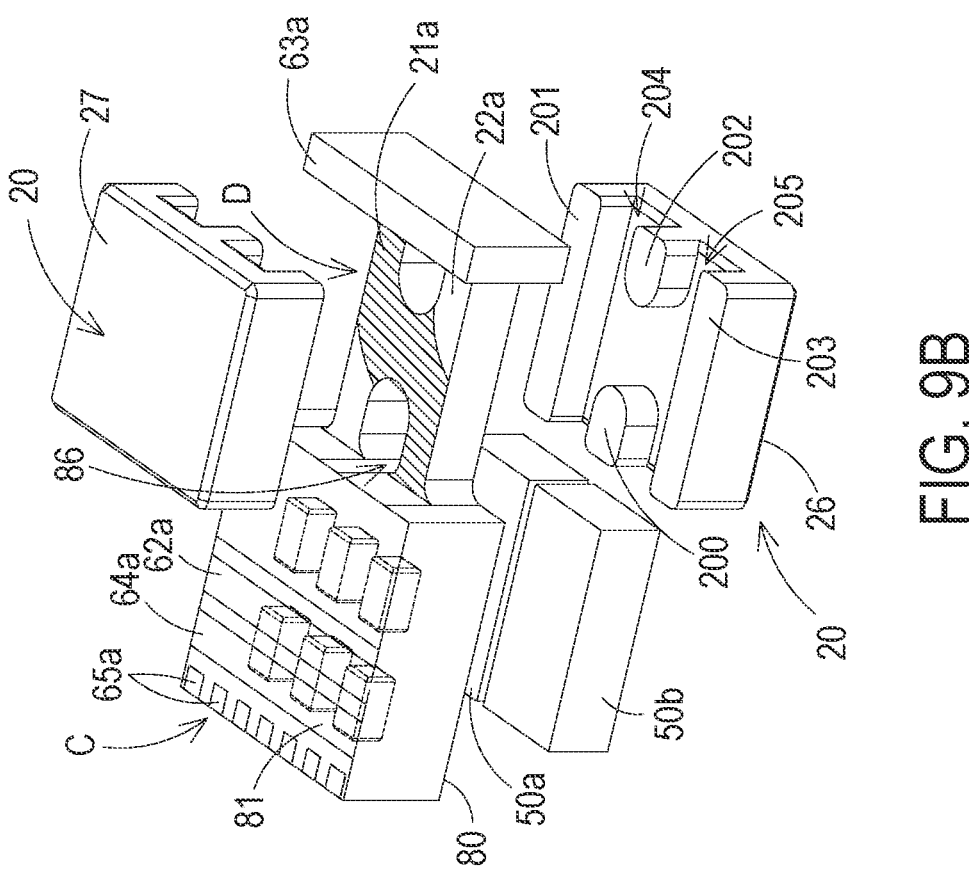
FIG. 9B is a schematic exploded view illustrating the power conversion module as shown in FIG. 9A and taken along another viewpoint.

FIG. 8A is a schematic assembled view illustrating a power conversion module according to a third embodiment of the present disclosure. FIG. 8B is a schematic assembled view illustrating the power conversion module as shown in FIG. 8A and taken along another viewpoint. FIG. 9A is a schematic exploded view illustrating the power conversion module as shown in FIG. 8A and taken along another viewpoint. FIG. 9B is a schematic exploded view illustrating the power conversion module as shown in FIG. 9A and taken along another viewpoint. The power conversion module 1c of this embodiment can also form a circuit topology as shown in FIG. 6. The power conversion module 1c includes at least one power component, a magnetic device 2 and a circuit board 8. The magnetic device 2 includes the magnetic core assembly 20, a first winding 21a and a second winding 22a. The structure of the magnetic core assembly 20 in this embodiment is similar to those of the magnetic core assembly 20 of the power conversion module 1 as shown in FIG. 1A. The relationships between the first winding 21a, the second winding 22a and the magnetic core assembly 20 of this embodiment are similar to those of the first embodiment, and not redundantly be described herein.

A first part of the circuit board 8 is disposed between the first magnetic cover 26 and the second magnetic cover 27 of the magnetic core assembly 20. A second part of the circuit board 8 is exposed outside the first magnetic cover 26 and the second magnetic cover 27 of the magnetic core assembly 20. In addition, the circuit board 8 has a multi-layered structure. The circuit board 8 has a first surface 80 and a second surface 81. The first surface 80 of the circuit board 8 is located near the first magnetic cover 26. The second surface 81 of the circuit board 8 located near the second magnetic cover 27. The first magnetic cover 26 can be disposed on the first surface 80 of the circuit board 8. The second magnetic cover 27 can be disposed on the second surface 81 of the circuit board 8.

In some embodiments, the circuit board 8 is divided into a first region C and a second region D. The first region C and the second region D are arranged side by side in the horizontal direction. The second region D of the circuit board 8 is aligned with the magnetic core assembly 20. In addition, the second region D of the circuit board 8 is connected with the first magnetic cover 26 and the second magnetic cover 27. In addition, a recess area 86 is recessed inwardly from the second surface 81 and corresponding to the second region D, so that the second magnetic cover 27 is accommodated in the recess area 86. The first region C of the circuit board 8 is misaligned with the magnetic core assembly 20 and exposed outside the magnetic core assembly 20. Moreover, the second region D of the circuit board 8 further includes two through holes 82, 83 and two magnetic core slots 84, 85. The two through holes 82 and 83 are aligned with the first magnetic leg 200 and the third magnetic leg 202, respectively. The first magnetic leg 200 and the third magnetic leg 202 are penetrated through the two through holes 82 and 83. Consequently, the first magnetic cover 26 and the second magnetic cover 27 are disposed on the second region D of the circuit board 8. The two magnetic core slots 84 and 85 are concavely formed in two opposed lateral walls of the circuit board 8 and aligned with the second magnetic leg 201 and the fourth magnetic leg 203, respectively. When the first magnetic cover 26 and the second magnetic cover 27 are disposed on the second region D of the circuit board 8, the second magnetic leg 201 and the fourth magnetic leg 203 are received within the two magnetic core slots 84 and 85, respectively.

In an embodiment, two copper bars (not shown) are embedded in the circuit board 8, and the two copper bars are formed as the first winding 21a and the second winding 22a.

In another embodiment, two copper bars (not shown) are directly embedded in the magnetic core assembly 20 and disposed between the first magnetic cover 26 and the second magnetic cover 27, and the two copper bars are formed as the first winding 21*a* and the second winding 22*a*. Moreover, an insulation medium (not shown) is formed in the intersection region between two copper bars (i.e., the first winding 21*a* and the second winding 22*a*) in the connection region 206, and thus the first winding 21*a* and the second winding 22*a* are isolated from each other through the insulation medium (not shown). Certainly, if the aforementioned two copper bars are directly embedded in the magnetic core assembly 20 to form the first winding 21*a* and the second winding 22*a*, the circuit board 8 may omit the second area D, so as to reduce the thickness of the circuit board 8.

In addition, two power components 50*a* and 50*b* are arranged side by side and disposed on the first surface 80 of the circuit board 8 at the first region C. Each of the power components 50*a* and 50*b* include a half-bridge arm with two switches. As shown in FIG. 6, the power component 50*a* includes a first half-bridge arm with two switches $Q_{1A}$ and $Q_{2A}$, and the power component 50*b* includes a second half-bridge arm with two switches $Q_{1N}$ and $Q_{2N}$. Each half-bridge arm is electrically connected with an input capacitor Cin. Moreover, the phase difference between the driving signals for controlling the two half-bridge arms is 180 degrees. In an embodiment, the top surfaces of the two power components 50*a* and 50*b* are located at the same level with the top surface of the first magnetic cover 26 in order to facilitate the installation of a heat sink (not shown).

In an embodiment, the power conversion module 1*c* further includes a component assembly 51. The component assembly 51 is disposed on the first surface 80 of the circuit board 8 and located at the first region C. The component assembly 51 includes capacitors, but not limited thereto.

In an embodiment, the power conversion module 1*c* further includes a pin layer. The pin layer is disposed on the second surface 81 of the circuit board 8. From the first region C to the second region D, at least one signal pin 65*a*, at least one input positive terminal 64*a*, at least one output negative terminal 62*a* and at least one output positive terminal 63*a* are sequentially disposed on the second surface 81 of the circuit board 8. The input positive terminal 64*a* is used as the input positive terminal Vin+ (see FIG. 6). The output negative terminal pin 62*a* is used as the output negative terminal Vo−. The signal pin 65*a* is used for transferring control signals and detection signals between the at least one power component and the system board. The output positive terminal pin 63*a* is used as an output positive terminal Vo+.

In an embodiment, the power conversion module 1*c* further includes an input capacitor Cin (see FIG. 6). The input capacitor Cin is embedded in the circuit board 8 in the first region C. It is preferred that the input capacitor Cin is located near the power components 50*a* and 50*b*.

In an embodiment, the circuit board 8 further includes a plurality of conductors (not shown). The conductors are formed in the circuit board 8 and used as at least one signal conductor, at least one output negative conductor, at least one input positive conductor and at least one output positive conductor. The input positive connector is electrically connected with the input positive terminal Vin+. The output negative conductor is connected with the output negative terminal Vo−. The at least one signal conductor is used for transferring control signals and detection signals between the at least one power component and the system board. The at least one output positive conductor is electrically connected with the output positive terminal Vo+.

In the embodiment of FIG. 2A, the magnetic device 2 and the power device of the power conversion module 1 are stacked on each other in the vertical direction. In contrast, the magnetic device and the power device of the power conversion module 1*c* of this embodiment are arranged side by side in the horizontal direction (i.e., disposed on the first region C and the second region D of the circuit board 8). Consequently, the overall thickness of the power conversion module 1*c* is reduced.

As shown in FIGS. 8A, 8B, 9A and 9B, the circuit board 8 and the magnetic core assembly 20 are two independent components. In order to reduce the horizontal assembly tolerance and the longitudinal assembly tolerance among the circuit board 8, the first winding 21, the second winding 22 and the magnetic core assembly 20 and avoid the issues such as low space utilization of the power conversion module, small effective cross section of the magnetic core assembly 20, low inductance of the inductor and large core loss of the inductor, in some embodiments similar to the previous content, the first magnetic leg 200, the second magnetic leg 201, the third magnetic leg 202 and the fourth magnetic leg 203 of the magnetic core assembly 20 shown in FIG. 9A can be formed by pressing iron powder materials. Then, the first magnetic cover 26*b* and the second magnetic cover 27*b* are assembled on the circuit board 8 to form the magnetic core assembly. The process of manufacturing the first magnetic leg 200, the second magnetic leg 201, the third magnetic leg 202 and the fourth magnetic leg 203 of the magnetic core assembly 20 shown in FIG. 9A by pressing iron powder material is described as follows. First, a circuit board 8 as shown in FIGS. 9A and 9B is provided. The circuit board 8 is divided into a first area C and a second area D. The first winding 21*a* and the second winding 22*a* are formed by two copper bars (not shown) embedded in the second area D of the circuit board 8 or internal wiring of the circuit board 8. Moreover, the second region D of the circuit board 8 further includes two through holes 82, 83 and two magnetic core slots 84, 85.

Then, the circuit board 8 is fixed in the hollow cavity of the mold (not shown).

Then, a specific amount of magnetic powder material is filled in the hollow cavity of the mold for allowing the magnetic powder material to fill the two through holes 82, 83 and the two magnetic core slots 84, 85. Then, the magnetic powder material is pressed, so that the magnetic powder is bonded to each other to form an iron powder core (i.e., magnetic legs). The magnetic powder materials located in the two magnetic core slots 84, 85 are formed as the second magnetic leg 201*a* and the fourth magnetic leg 203*a*, which are similar to the second magnetic leg 201 and the fourth magnetic leg 203 as shown in FIGS. 9A and 9B. The magnetic powder materials located in the two through holes 82, 83 are formed as the first magnetic leg 200*a* and the third magnetic leg 202*a*, which are similar to the first magnetic leg 200 and the third magnetic leg 202 as shown in FIGS. 9A and 9B. In addition, all the magnetic legs are integrally formed as an integrated structure and further bonded with the circuit board 8. Each of the magnetic legs has a first end and a second end opposed to each other. The first end of each of the magnetic legs is in coplanar with the first surface 80 of the circuit board 8, and the second end of each of the magnetic legs is in coplanar with the second surface 81 of the circuit board 8 (see FIG. 10).

Then, the first magnetic cover 26*b* which is a planar structure is disposed on the second region D of the circuit board 8 from the first surface 80, and the second magnetic cover 27*b* which is a planar structure is disposed on the second region D of the circuit board 8 from the second surface 81. Consequently, the first magnetic cover 26b, the second magnetic cover 27b, the first magnetic leg 200a, the second magnetic leg 201a, the third magnetic leg 202a and the fourth magnetic leg 203a are formed as the magnetic core assembly. The magnetic core assembly, the first winding 21a and the second winding 22a are formed as the magnetic device as shown in FIGS. 8A and 8B.

In some embodiments, the level of the first surface 26c of the first magnetic cover 26c is higher than the level of the first surface 80 of the circuit board 8, and the first surface 26c of the first magnetic cover 26b is approximately coplanar with the power component (e.g., power component 50a, 50b), which is disposed on the first surface 80 of the circuit board 8 and located at the first area C. The level of the first surface 27c of the second magnetic cover 27b is higher than the level of the second surface 81 of the circuit board 8.

Figure 10:
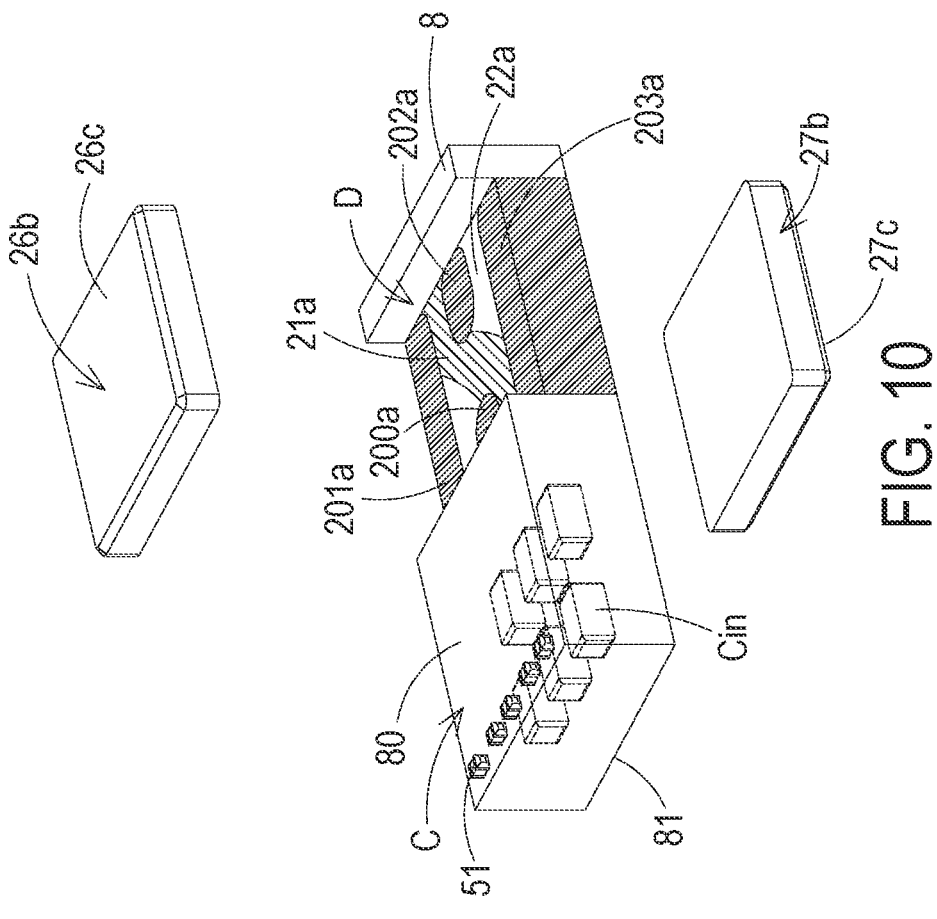
FIG. 10 is a schematic assembled view illustrating a power conversion module according to a fourth embodiment of the present disclosure.

In some embodiments, the first magnetic cover 26b and the second magnetic cover 27b as shown in FIG. 10 can also be formed by pressing the magnetic powder materials. That is, when the circuit board 8 is fixed in the hollow cavity of the mold (not shown), a specific amount of magnetic powder material is not only filled in the two through holes 82, 83 and the two magnetic core slots 84, 85, but also pressed on the opposed surfaces of the circuit board 8 to form the first magnetic cover and the second magnetic cover. Consequently, the first magnetic cover and the second magnetic cover are integrally formed with the first magnetic leg 200a, the second magnetic leg 201a, the third magnetic leg 202a and the fourth magnetic leg 203a, which are similar to those shown in FIGS. 8A and 8B.

From the above descriptions, the present disclosure provides the power conversion module and the magnetic device. The structure of the magnetic device of the power conversion module is specially designed. The input terminal of the first winding is disposed within the first part of the first winding groove between the first magnetic leg and the second magnetic leg. The output terminal of the first winding is disposed within the second part of the second winding groove between the third magnetic leg and the fourth magnetic leg. The input terminal of the second winding is disposed within the first part of the second winding groove between the first magnetic leg and the fourth magnetic leg. The output terminal of the second winding is disposed within the second part of the first winding groove between the second magnetic leg and the third magnetic leg. Since the first winding and the second winding intersect each other, the distances between the each of the output terminals of the two coupled inductors and the output terminal of the power conversion module are nearly equal. In addition, the asymmetry of the equivalent series resistances of the two coupled inductors is reduced, and the currents flowing through the two coupled inductors are nearly equal. Since the DC magnetic fluxes flowing through the first magnetic leg and the third magnetic leg are nearly zero, the first magnetic leg and the third magnetic leg are not readily subjected to magnetic saturation. Moreover, due to the arrangement of the first winding and the second winding, the distances between each of the output terminals of the two coupled inductors and the output terminal of the power conversion module are the shortest respectively. In this way, the minimum equivalent series resistances of the two coupled inductors can be achieved. Consequently, the conduction loss is largely reduced, and the performance of the power conversion module is enhanced.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A power conversion module, comprising:
   a magnetic device comprising:
      a magnetic core assembly comprising:
         a first magnetic leg;
         a second magnetic leg;
         a third magnetic leg, wherein the first magnetic leg and the third magnetic leg are opposed to each other;
         a fourth magnetic leg, wherein the second magnetic leg and the fourth magnetic leg are opposed to each other, and the first magnetic leg and the third magnetic leg are disposed between the second magnetic leg and the fourth magnetic leg;
         a first winding groove, wherein a first part of the first winding groove is disposed between the first magnetic leg and the second magnetic leg, and a second part of the first winding groove is disposed between the second magnetic leg and the third magnetic leg; and
         a second winding groove, wherein a first part of the second winding groove is disposed between the first magnetic leg and the fourth magnetic leg, and a second part of the second winding groove is disposed between the third magnetic leg and the fourth magnetic leg;
      a first winding, wherein an input terminal of the first winding is disposed within the first part of the first winding groove, and an output terminal of the first winding is disposed within the second part of the second winding groove; and
      a second winding, wherein an input terminal of the second winding is disposed within the first part of the second winding groove, and an output terminal of the second winding is disposed within the second part of the first winding groove,
         wherein an air gap of each of the second magnetic leg and the fourth magnetic leg is longer than an air gap of each of the first magnetic leg and the third magnetic leg, and a magnetic resistance of each of the second magnetic leg and the fourth magnetic leg is greater than a magnetic resistance of each of the first magnetic leg and the third magnetic leg, wherein the first winding groove and the second winding groove are in connection with each other through a connection region, the part of the first winding and the part of the second winding in the connection region intersect each other;
   a first power component electrically connected with the input terminal of the first winding; and
   a second power component electrically connected with the input terminal of the second winding.

2. The power conversion module according to claim 1, wherein the magnetic core assembly further comprises a first magnetic cover and a second magnetic cover, which are opposed to each other, wherein the first magnetic leg, the second magnetic leg, the third magnetic leg and the fourth magnetic leg are disposed between the first magnetic cover and the second magnetic cover.

3. The power conversion module according to claim 2, wherein the power conversion module further comprises a circuit board, and a part of the circuit board is disposed between the first magnetic cover and the second magnetic cover of the magnetic core assembly, wherein the circuit board has a first surface and a second surface, which are opposed to each other, wherein the first surface of the circuit board is located near the first magnetic cover, the second surface of the circuit board is located near the second magnetic cover, and the first power component and the second power component are disposed on the first surface of the circuit board.

4. The power conversion module according to claim 3, wherein the circuit board comprises a first region and a second region, and the first region and the second region are arranged side by side in the horizontal direction, wherein the second region of the circuit board is aligned with the magnetic core assembly, and the first region is misaligned with the magnetic core assembly and exposed outside the magnetic core assembly.

5. The power conversion module according to claim 4, wherein the first power component and the second power component are disposed on the first region of the circuit board.

6. The power conversion module according to claim 5, wherein a top surface of each of the first power component and the second power component is coplanar with a top surface of the first magnetic cover.

7. The power conversion module according to claim 4, wherein the power conversion module further comprises a pin layer, and the pin layer is disposed on the second surface of the circuit board, wherein at least one signal pin, at least one input positive terminal, at least one output negative terminal and at least one output positive terminal are sequentially disposed on the second surface of the circuit board from the first region to the second region.

8. The power conversion module according to claim 4, wherein the power conversion module further comprises at least one input capacitor, wherein the at least one input capacitor is embedded in the circuit board and disposed in the first region of the circuit board.

9. The power conversion module according to claim 3, wherein the first power component and the second power component are embedded in the circuit board.

10. The power conversion module according to claim 2, wherein the magnetic device further comprises:
   a winding carrier having a first surface and a second surface, which are opposed to each other, wherein the magnetic core assembly is embedded in the winding carrier, the first magnetic cover of the magnetic core assembly is located near the first surface of the winding carrier, and the second magnetic cover of the magnetic core assembly is located near the second surface of the winding carrier; and a conductive structure disposed between the first surface and the second surface of the winding carrier, wherein at least a part of the conductive structure is exposed on the first surface or the second surface of the winding carrier, and a part of the conductive structure is formed as the first winding and the second winding.

11. The power conversion module according to claim 10, wherein the power conversion module further comprises a power device, and the power device is disposed on the first surface of the winding carrier, wherein the power device comprises the first power component and the second power component, and the first power component and the second power component are electrically connected with the conductive structure.

12. The power conversion module according to claim 11, wherein the power device further comprises a circuit board, wherein the circuit board has a first surface and a second surface opposed to the first surface, wherein the second surface of the circuit board is located near the first surface of the winding carrier.

13. The power conversion module according to claim 12, wherein the first power component and the second power component are disposed on the first surface of the circuit board.

14. The power conversion module according to claim 12, wherein the first power component and the second power component are embedded in the circuit board.

15. The power conversion module according to claim 1, wherein the first power component comprises a first half-bridge arm with two switches, and the second power component comprises a second half-bridge arm with two switches, wherein a phase difference between a first driving signal for controlling the first half-bridge arm and a second driving signal for controlling the second half-bridge arm is 180 degrees.

16. The power conversion module according to claim 1, wherein the output terminal of the first winding and the output terminal of the second winding are directly connected with each other, and electrically connected with an output positive terminal of the power conversion module.

* * * * *